(12) United States Patent
Glacer et al.

(10) Patent No.: US 10,104,478 B2
(45) Date of Patent: Oct. 16, 2018

(54) SYSTEM AND METHOD FOR A PERPENDICULAR ELECTRODE TRANSDUCER

(71) Applicant: Infineon Technologies AG, Neubiberg (DE)

(72) Inventors: Christoph Glacer, Munich (DE); Alfons Dehe, Reutlingen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 311 days.

(21) Appl. No.: 14/941,220

(22) Filed: Nov. 13, 2015

(65) Prior Publication Data

US 2017/0142525 A1    May 18, 2017

(51) Int. Cl.
| | |
|---|---|
| *H04R 19/04* | (2006.01) |
| *B81B 3/00* | (2006.01) |
| *B81C 1/00* | (2006.01) |
| *H04R 3/00* | (2006.01) |
| *H04R 7/12* | (2006.01) |
| *H04R 19/00* | (2006.01) |
| *H04R 31/00* | (2006.01) |

(52) U.S. Cl.
CPC ........... *H04R 19/04* (2013.01); *B81B 3/0008* (2013.01); *B81B 3/0021* (2013.01); *B81C 1/00158* (2013.01); *H04R 3/00* (2013.01); *H04R 7/122* (2013.01); *H04R 19/005* (2013.01); *H04R 31/00* (2013.01); *H04R 31/003* (2013.01); *B81B 2201/0257* (2013.01); *B81B 2203/0127* (2013.01); *B81B 2203/04* (2013.01); *B81C 2201/013* (2013.01); *H04R 2207/00* (2013.01)

(58) Field of Classification Search
CPC .......... H04R 19/04; H04R 31/00; H04R 3/00; H04R 7/122; H04R 31/003; H04R 19/005; H04R 2207/00; B81B 3/0008; B81B 3/0021; B81B 2201/0257; B81B 2203/0127; B81B 2203/04; B81C 1/00158; B81C 2201/013
USPC .......................................................... 381/174
See application file for complete search history.

(56) References Cited

U.S. PATENT DOCUMENTS

| | | | |
|---|---|---|---|
| 4,453,242 A | 6/1984 | Toda | |
| 6,168,906 B1 * | 1/2001 | Bernstein | ................ B81B 3/007 216/39 |
| 7,372,348 B2 | 5/2008 | Xu et al. | |
| 7,545,945 B2 * | 6/2009 | Miles | ..................... H04R 19/04 381/174 |
| 8,146,426 B2 * | 4/2012 | Sugiura | ............... G01P 15/0802 73/504.14 |
| 8,736,000 B1 | 5/2014 | Manginell et al. | |
| 9,207,138 B2 * | 12/2015 | He | ..................... B81C 1/00698 |

(Continued)

FOREIGN PATENT DOCUMENTS

SU        669237    *    6/1979    ............... G01L 9/12

*Primary Examiner* — Oyesola C Ojo
(74) *Attorney, Agent, or Firm* — Slater Matsil, LLP

(57) ABSTRACT

According to an embodiment, a method of operating a microelectromechanical systems (MEMS) transducer that has a membrane includes transducing between out-of-plane deflection of the membrane and voltage on a first pair of electrostatic drive electrodes using the first pair of electrostatic drive electrodes. The first pair of electrostatic drive electrodes is formed on the membrane extending in an out-of-plane direction and form a variable capacitance between the first pair of electrostatic drive electrodes.

30 Claims, 17 Drawing Sheets

(56) References Cited

U.S. PATENT DOCUMENTS

| | | | |
|---|---|---|---|
| 9,409,764 B2* | 8/2016 | Reinmuth | B81B 7/0061 |
| 9,541,463 B2* | 1/2017 | He | B81C 1/00698 |
| 2002/0009821 A1* | 1/2002 | Moor | B81B 3/0072 |
| | | | 438/48 |
| 2009/0199637 A1* | 8/2009 | Sugiura | G01P 15/0802 |
| | | | 73/514.32 |
| 2010/0181871 A1 | 7/2010 | Daniel et al. | |
| 2010/0294041 A1* | 11/2010 | Tai | A61B 3/16 |
| | | | 73/718 |
| 2012/0068571 A1* | 3/2012 | Chen | B06B 1/0292 |
| | | | 310/300 |
| 2014/0054731 A1* | 2/2014 | Graham | B81B 3/0081 |
| | | | 257/415 |
| 2015/0061047 A1* | 3/2015 | He | B81C 1/00698 |
| | | | 257/415 |
| 2015/0078590 A1* | 3/2015 | Daley | B81B 3/007 |
| | | | 381/190 |

* cited by examiner

300 

```
┌─────────────────────────────────────────────────┐
│ Transducing Between Out-of-plane Deflection of  │
│ Membrane and Voltage on First Pair of Electrostatic │─ 302
│ Drive Electrodes using First Pair of Electrostatic │
│               Drive Electrodes                   │
└─────────────────────────────────────────────────┘
```

FIG 9

310 

```
┌─────────────────────────────────────────────────┐
│         Forming Trenches in Substrate            │─ 312
└─────────────────────────────────────────────────┘
                        ↓
┌─────────────────────────────────────────────────┐
│ Forming Electrode Layer in Trenches and over and in │─ 314
│              Contact with Substrate              │
└─────────────────────────────────────────────────┘
                        ↓
┌─────────────────────────────────────────────────┐
│ Patterning First Electrode and Second Electrode in │
│ Electrode Layer, Wherein First Electrode And Second │─ 316
│         Electrode Are Formed In Trenches         │
└─────────────────────────────────────────────────┘
                        ↓
┌─────────────────────────────────────────────────┐
│ Forming Insulation Layer Between First Electrode and │
│ Second Electrode, Wherein First Electrode, Second │─ 318
│    Electrode, and Insulation Layer Form Membrane │
└─────────────────────────────────────────────────┘
                        ↓
┌─────────────────────────────────────────────────┐
│   Forming First Conductive Line Contacting First │─ 320
│                    Electrode                     │
└─────────────────────────────────────────────────┘
                        ↓
┌─────────────────────────────────────────────────┐
│  Forming Second Conductive Line Contacting Second │─ 322
│                    Electrode                     │
└─────────────────────────────────────────────────┘
                        ↓
┌─────────────────────────────────────────────────┐
│ Etching Cavity in Substrate Below First Electrode and │─ 324
│                 Second Electrode                 │
└─────────────────────────────────────────────────┘
```

FIG 10

SYSTEM AND METHOD FOR A PERPENDICULAR ELECTRODE TRANSDUCER

TECHNICAL FIELD

The present invention relates generally to microfabricated transducers, and, in particular embodiments, to a system and method for a perpendicular electrode transducer.

BACKGROUND

Transducers convert signals from one domain to another and are often used as sensors. For example, acoustic transducers convert between acoustic signals and electrical signals. A microphone is one type of acoustic transducer that converts sound waves, i.e., acoustic signals, into electrical signals, and a speaker is one type of acoustic transducer that converts electrical signals into sound waves.

Microelectromechanical system (MEMS) based sensors include a family of transducers produced using micromachining techniques. Some MEMS, such as a MEMS microphone, gather information from the environment by measuring the change of physical state in the transducer and transferring the signal to be processed by the electronics which are connected to the MEMS sensor. Some MEMS, such as a MEMS microspeaker, convert electrical signals into a change in the physical state in the transducer. MEMS devices may be manufactured using micromachining fabrication techniques similar to those used for integrated circuits.

As an example, a capacitive MEMS microphone includes a backplate electrode and a membrane arranged in parallel with the backplate electrode. The backplate electrode and the membrane form a parallel plate capacitor. The backplate electrode and the membrane are supported by a support structure arranged on a substrate.

The capacitive MEMS microphone is able to transduce sound pressure waves, for example speech, at the membrane arranged in parallel with the backplate electrode. The backplate electrode is perforated such that sound pressure waves pass through the backplate while causing the membrane to vibrate due to a pressure difference formed across the membrane. Hence, the air gap between the membrane and the backplate electrode varies with vibrations of the membrane. The variation of the position of the membrane in relation to the backplate electrode causes variation in the capacitance between the membrane and the backplate electrode. This variation in the capacitance is transformed into an output signal responsive to the movement of the membrane and forms a transduced signal.

Using a similar structure, a voltage signal may be applied between the membrane and the backplate in order to cause the membrane to vibrate and generate sound pressure waves. Thus, a capacitive plate MEMS structure may operate as a microspeaker.

For capacitive MEMS sensors, it is possible, in the presence of moderate physical signals or shock, for one of the deflectable plates to deflect until contacting an adjacent plate. In such cases, the voltage applied to the plates may cause the plates to remain in contact with one another. This phenomenon may be referred to as "pull-in". In capacitive MEMS sensors, pull-in may affect the performance of the sensor and may lead to reduced performance or failure of the device.

SUMMARY

According to an embodiment, a method of operating a microelectromechanical systems (MEMS) transducer that has a membrane includes transducing between out-of-plane deflection of the membrane and voltage on a first pair of electrostatic drive electrodes using the first pair of electrostatic drive electrodes. The first pair of electrostatic drive electrodes is formed on the membrane extending in an out-of-plane direction and form a variable capacitance between the first pair of electrostatic drive electrodes.

BRIEF DESCRIPTION OF THE DRAWINGS

For a more complete understanding of the present invention, and the advantages thereof, reference is now made to the following descriptions taken in conjunction with the accompanying drawings, in which:

FIG. 9 illustrates a block diagram of an embodiment method of operating an embodiment MEMS transducer;

FIG. 10 illustrates a block diagram of an embodiment method of forming an embodiment MEMS transducer;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely MEMS transducers, and more particularly, MEMS acoustic transducers. Some of the various embodiments described herein include MEMS transducer systems, MEMS microphones, MEMS microspeakers, MEMS transducers including perpendicular electrostatic electrodes, and movable electrodes formed on a deflectable MEMS membrane. In other embodiments, aspects may also be applied to other applications involving any type of transducer converting a physical signal to another domain according to any fashion as known in the art.

In general applications including, for example, capacitive microphones and microspeakers, a MEMS transducer includes a membrane or diaphragm and a backplate or counter-electrode. As described hereinabove, the possibility of pull-in or collapse is present in such devices. Further, as deflections increase, even if pull-in does not occur, clipping may occur when the diaphragm strikes the counter-electrode in conventional microphones. Further, in some applications, the vertical movement of the membrane is limited by the air gap formed between the membrane and the backplate. Thus, certain limitations in performance may be introduced by a transducer that includes a membrane and backplate.

According to various embodiments described herein, a MEMS transducer includes a membrane with perpendicular electrode pairs formed extending away from the membrane. Deflection of the membrane causes the perpendicular electrode pairs to move such that some portion of each electrode in each perpendicular electrode pair moves closer together or further apart with respect to the other electrode in the perpendicular electrode pair. As the electrodes in each electrode pair move with respect to one another, the capacitance of the electrode structure changes. Thus, physical signals incident on the transducer membrane that cause the transducer membrane to deflect, such as acoustic signals for example, produce measureable electrical signals at each electrode pair. Similarly, voltages applied to the electrode pair produce electrostatic forces between the perpendicular electrodes that cause the transducer membrane to deflect and generate physical signals, such as acoustic signals for example. Such embodiments may operate without any backplate or counter-electrode. In various embodiments, the perpendicular structure and shape operates with the membrane according to a lever mechanism that allows large deflections of the membrane without exhibiting pull-in or clipping.

Figure 1:
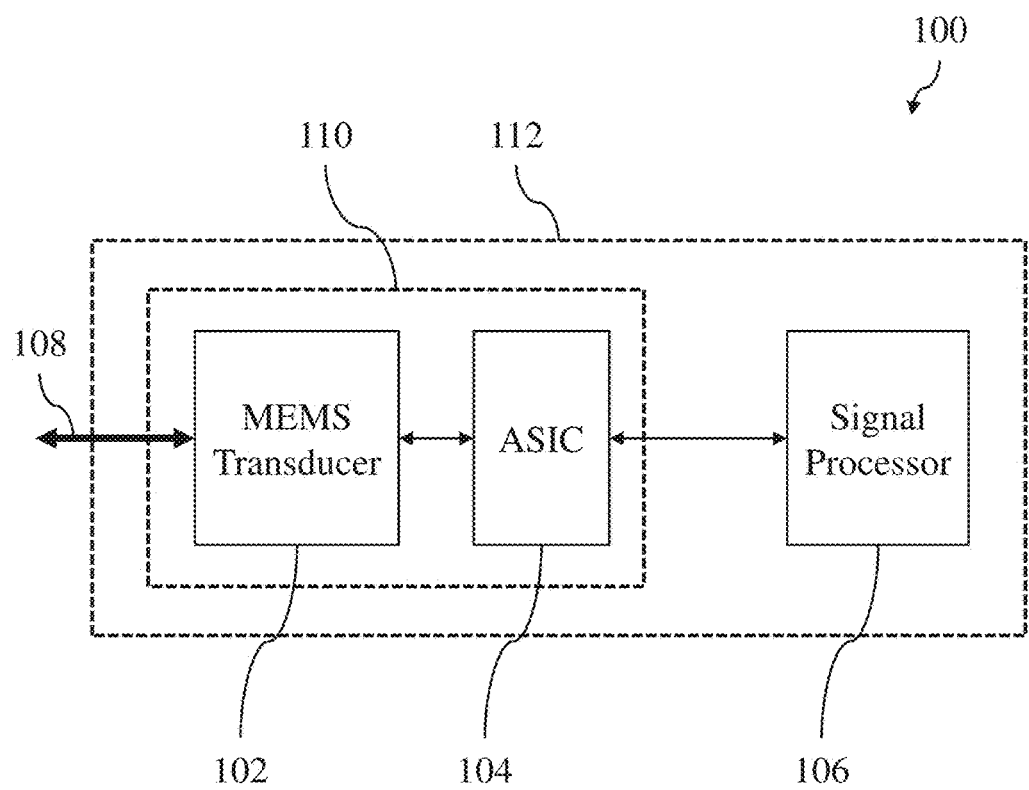
FIG. 1 illustrates a system block diagram of an embodiment MEMS transducer system.

FIG. 1 illustrates a system block diagram of an embodiment MEMS transducer system 100 including MEMS transducer 102, application specific integrated circuit (ASIC) 104, and signal processor 106. According to various embodiments, MEMS transducer 102 is coupled to the ambient environment of MEMS transducer system 100 through environmental coupling 108. MEMS transducer system 100 may include device housing 112. In various embodiments, environmental coupling 108 is provided by a port, such as a sound port, in device housing 112.

In various embodiments, MEMS transducer 102 and ASIC 104 are included in sub-package 110. In some embodiments, sub-package 110 is a single integrated circuit (IC) die that includes both MEMS transducer 102 and ASIC 104 integrated together in the same semiconductor die. In other embodiments, sub-package 110 is a circuit board, such as a printed circuit board (PCB), with separate ICs for MEMS transducer 102 and ASIC 104 attached to the circuit board. In such embodiments, sub-package 110 may also include a device cover or package that protects MEMS transducer 102 and ASIC 104. Sub-package 110 is included within device housing 112 and environmental coupling 108 provides physical coupling between the ambient environment of MEMS transducer system 100 and MEMS transducer 102 in sub-package 110. Thus, sub-package 110 may also include a port, such as a sound port.

According to various embodiments, MEMS transducer 102 includes a deflectable structure, such as a membrane, that includes at least one perpendicular electrode pair for transduction between physical deflections of the deflectable structure and electrical signals. In some embodiments, MEMS transducer 102 does not include any backplate. MEMS transducer 102 operates as a sensor in some embodiments by sensing deflections of the deflectable structure as electrical signals at the perpendicular electrode pair. In particular embodiments, MEMS transducer 102 operates as a MEMS microphone by sensing deflections of the deflectable structure caused by acoustic signals incident on the deflectable structure. In other embodiments, MEMS transducer 102 operates as an actuator by causing deflections of the deflectable structure using voltage signals applied to the perpendicular electrode pair. In particular embodiments, MEMS transducer 102 operates as a MEMS microspeaker by causing deflections of the deflectable structure that produce acoustic signals.

According to various embodiments, ASIC 104 operates as an interface circuit for MEMS transducer 102. In such embodiments, ASIC 104 may include a readout circuit with an amplifier for amplifying transduced electrical signals. In some embodiments, ASIC 104 may also include a bias circuit for applying a bias voltage to the perpendicular electrode pair. ASIC 104 may include a drive circuit for driving a voltage signal at the perpendicular electrode pair in order to generate a particular series of deflections of the deflectable structure. Thus, ASIC 104 may include the readout circuit when MEMS transducer 102 is a sensor, such as a microphone, and ASIC 104 may include the drive circuit when MEMS transducer 102 is an actuator, such as a microspeaker.

In various embodiments, signal processor 106 transmits and receives signals to and from ASIC 104 for operating MEMS transducer 102. Signal processor may generate drive signals that produce acoustic signals or may interpret electrical signals to generate digital representations of acoustic signals. In various embodiments, signal processor 106 may be a dedicated digital signal processor (DSP), a general purpose microprocessor, or an audio processor, for example. In some embodiments, signal processor 106 is included in device housing 112. In alternative embodiments, signal processor 106 is external to device housing 112 and may be included in a separate system that is coupled to ASIC 104.

Figure 2A:
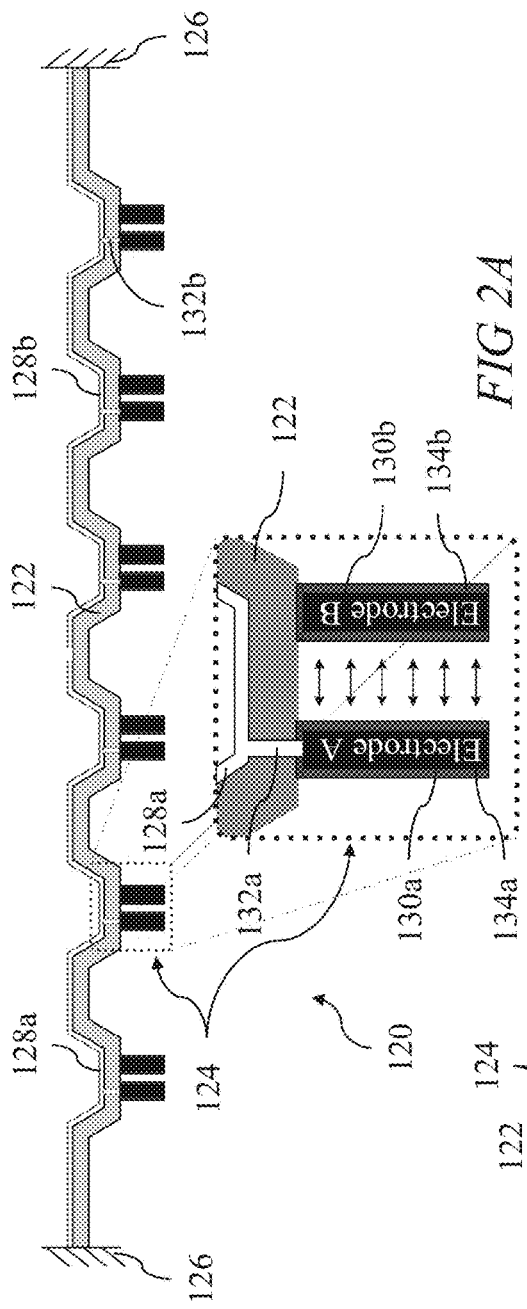
FIGS. 2A and 2B illustrate schematic side view and top view diagrams of an embodiment MEMS transducer.
Figure 2B:
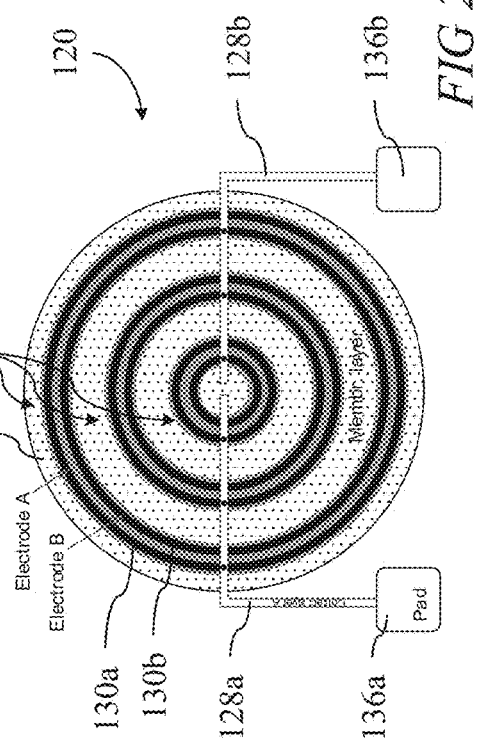

FIGS. 2A and 2B illustrate embodiment schematic side view and top view diagrams of an embodiment MEMS transducer 120 including membrane 122, perpendicular electrode pairs 124, anchor 126, contact line 128a, and contact line 128b. According to various embodiments, perpendicular electrode pairs 124 are attached to membrane 122 and extend away from membrane 122. Perpendicular electrode pairs 124 each include electrode 130a and electrode 130b. Membrane 122 is fixed at anchor 126, which may be a substrate of a support structure on the substrate, for example. In some embodiments, membrane 122 is circular, as shown, and is fixed to anchor 126 around the circumference of membrane 122.

In various embodiments, when a voltage is applied between electrode 130a and electrode 130b, an electrostatic force is generated between electrode 130a and electrode 130b that attracts electrode 130a and electrode 130b together. When electrode 130a and electrode 130b bend together based on the electrostatic force, membrane 122 also bends to accommodate the bending of electrode 130a and electrode 130b, which results in a deflection of membrane 122. In such embodiments, a voltage signal may be applied to electrode 130a and electrode 130b to generate deflections of membrane 122 in order to generate a physical signal. For example, an acoustic signal may be generated at membrane 122 that includes various frequencies generated by the excitation of membrane 122 at the particular frequencies. Thus, perpendicular electrode pairs 124 may be driven in order to generate acoustic signals and MEMS transducer 120 may operate as a MEMS microspeaker. In some embodiments, MEMS transducer 120 is part of an array of such microspeakers that are driven together in order to generate acoustic signals with larger sound pressure level (SPL).

In some embodiments, physical signals incident on membrane 122 cause deflection of membrane 122. The deflections of membrane 122 produce movement of electrode 130a and electrode 130b with respect to each other and change the capacitance between electrode 130a and electrode 130b. A readout circuit may measure a voltage signal produced as the capacitance changes between electrode 130a and electrode 130b. In such embodiments, physical signals, such as acoustic signals, incident on membrane 122 may be transduced through membrane 122 and perpendicular electrode pairs 124 to generate voltage signals based on the physical signal. Thus, perpendicular electrode pairs 124 may generate voltage signals based on incident acoustic signals and MEMS transducer 120 may operate as a MEMS microphone in some embodiments.

According to various embodiments, contact line 128a is coupled to electrode 130a and contact line 128b is coupled to electrode 130b. Electrode 130a may be surrounded or insulated by insulator 134a and electrode 130b may be surrounded or insulated by insulator 134b. In various embodiments, via 132a may pass through membrane 122 to electrically coupled contact line 128a to electrode 130a and via 132b may pass through membrane 122 to electrically coupled contact line 128b to electrode 130b.

According to some embodiments, membrane 122 may be corrugated as shown. In such embodiments, the bends or corrugations in membrane 122 may increase the flexibility of membrane 122. In various embodiments, any number of corrugations may be included. In particular embodiments, the number of corrugations included ranges from 10 to 50 corrugations. As shown, in some embodiments, perpendicular electrode pairs 124 may be formed in the corrugation valleys. In alternative embodiments, perpendicular electrode pairs 124 are formed in the corrugations peaks or plateaus. In other embodiments, membrane 122 may be planar and not include corrugations.

In particular embodiments, membrane 122 may be formed with layer stress producing a resting deflection of membrane 122 when membrane 122 is released. For example, membrane may include a layer with intrinsic stress or may include different structures with unbalanced layer stress. In such embodiments, when membrane 122 is released during a fabrication process, the internal layer stress causes membrane 122 to deflect to a resting position with some curve or bend in membrane 122.

According to particular embodiments, perpendicular electrode pairs 124 may also be formed in the upward direction (not shown). As shown in FIG. 2B, MEMS transducer 120 includes three perpendicular electrode pairs 124 that are circular and concentric in some embodiments. In other embodiments, only a single perpendicular electrode pair 124 is used. In still further various embodiments, the number of perpendicular electrode pairs may range from 1 to 50 perpendicular electrode pairs. In particular embodiments, each corrugation may include a perpendicular electrode pair. Further, more than one perpendicular electrode pair may be used on each corrugation in some alternative embodiments.

In various embodiments, membrane 122 may have a circular shape as shown. In other embodiments, membrane 122 may include other shapes, such as a rectangular shape as described further herein below. For example, membrane 122 may be rectangular and anchored on one or two sides. In such embodiments, perpendicular electrode pair 124 may be arranged as parallel lines across membrane 122. Perpendicular electrode pairs 124 are arranged as concentric circular electrodes on membrane 122 in some embodiments. In other embodiments, perpendicular electrode pairs 124 may be arranged in other arrangements, such as in parallel lines along membrane 122.

According to various embodiments, contact line 128a is electrically coupled to contact pad 136a and contact line 128b is electrically coupled to contact pad 136b. An interface circuit, such as ASIC 104 described hereinabove in reference to FIG. 1, may be coupled to contact pad 136a and 136b in order to provide drive signals to, or readout signals from, MEMS transducer 120.

According to various embodiments, membrane 122 may include a ventilation hole (not shown) for equalizing low frequency pressure changes across membrane 122. The ventilation hole may be formed in the center of membrane or near the circumference in various embodiments. In other embodiments, the ventilation hole may be arranged in any part of membrane 122 or in a substrate or support structure connected to membrane 122.

In particular embodiments, MEMS transducer 120 may operate or be structured to operate in a sliding mode of operation. In such embodiments, electrode 130a and electrode 130b are actuated by applying a voltage between electrode 130a and electrode 130b until the electrode tips contact each other. Insulator 134a and insulator 134b maintain electrical insulation between electrode 130a and electrode 130b in order to prevent a short circuit. When electrode 130a and electrode 130b are touching at the electrode tips, small voltage variations apply increased electrostatic forces between electrode 130a and electrode 130b because the separation distance is small. The increased electrostatic forces applied to electrode 130a and electrode 130b cause the electrodes to squeeze together and generate an increased force on membrane 122. In some embodiments, a mechanical connection, such as an insulating material, may connect the electrode tips of electrode 130a and electrode 130b in order to provide operation in the sliding mode.

In embodiments where the electrode tips are touching or where there is a mechanical connection between the electrode tips for electrode 130a and electrode 130b, an increased voltage applied between electrode 130a and electrode 130b causes portions along the shafts of electrode 130a and electrode 130b to move closer together. For example, when the electrode tips are free to move, electrode 130a and electrode 130b operate as fixed-free beams and have maximum deflections primarily at the electrode tips, but when the electrode tips are fixed, either through touching or an added mechanical connection, electrode 130a and electrode 130b operate as fixed-fixed beams and have maximum deflections primarily in a central region along the shafts of electrode 130a and electrode 130b.

Figure 3A:
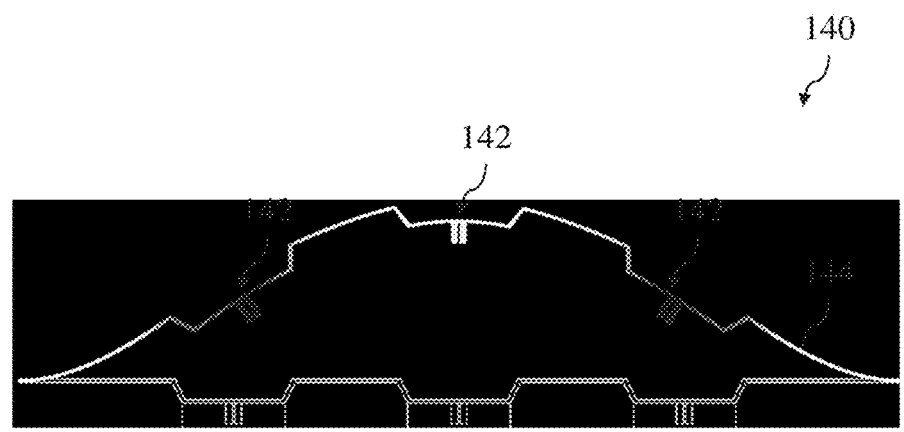
FIGS. 3A and 3B illustrate schematic side view diagrams of embodiment MEMS transducers in deflection.
Figure 3B:
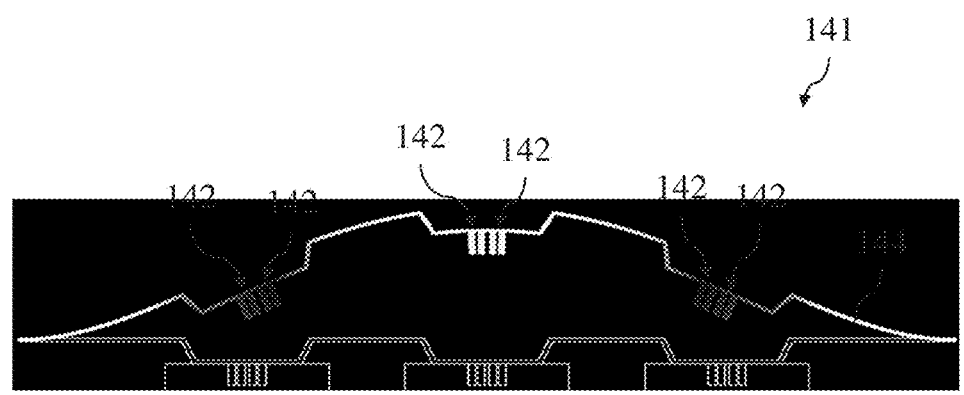

FIGS. 3A and 3B illustrate schematic side view diagrams of embodiment MEMS transducer 140 and MEMS transducer 141 in deflection. According to various embodiments, MEMS transducer 140 includes a single perpendicular electrode pair 142 in the well of each corrugation in membrane 144. Membrane 144 is illustrated with three corrugation wells, but other embodiments may include any number of corrugations. Further, various embodiments may include membrane 144 as a planar membrane without any corrugations. FIG. 3A illustrates MEMS transducer 140 in deflection and illustrates un-deflected MEMS transducer 140 in outline.

In various embodiments, MEMS transducer 141 is similar to MEMS transducer 140 with the addition of a second perpendicular electrode pair 142 in the well of each corrugation in membrane 144. In such embodiments, each corrugation well includes two perpendicular electrode pairs 142. FIG. 3B illustrates MEMS transducer 141 in deflection and illustrates un-deflected MEMS transducer 141 in outline. In embodiments without any corrugation, each perpendicular electrode pair 142 is spaced by a certain distance. Perpendicular electrode pairs 142 may be grouped together in subsets that are spaced apart on membrane 144 or perpendicular electrode pairs 142 may be evenly spaced apart for each electrode pair. Some embodiments include only a single perpendicular electrode pair 142. In other embodiments, the number of perpendicular electrode pairs 142 may range from 1 to 50 perpendicular electrode pairs 142. MEMS transducer 140 and MEMS transducer 141 are schematic illustrations of embodiment MEMS transducers and may include features and structures as described herein in reference to the other embodiments.

Figure 4A:
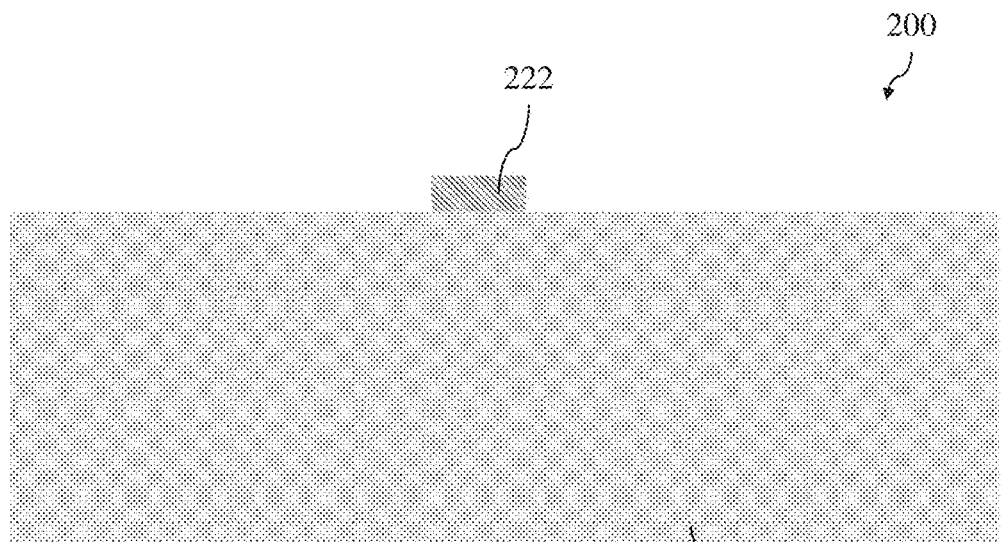
FIGS. 4A, 4B, 4C, 4D, 4E, 4F, 4G, 4H, 4I, and 4J illustrate cross sectional diagrams of an embodiment MEMS transducer at different steps in an embodiment fabrication process.

FIGS. 4A, 4B, 4C, 4D, 4E, 4F, 4G, 4H, 4I, and 4J illustrate cross sectional diagrams of an embodiment MEMS transducer at different steps in an embodiment fabrication process. FIG. 4A depicts structure 200, which includes substrate 220 and tetraethyl orthosilicate (TEOS) mesa 222. In such embodiments, TEOS mesa 222 is formed on substrate 220. TEOS mesa may be formed by depositing a TEOS layer and lithographically patterning the TEOS layer to form TEOS mesa 222.

Figure 4B:
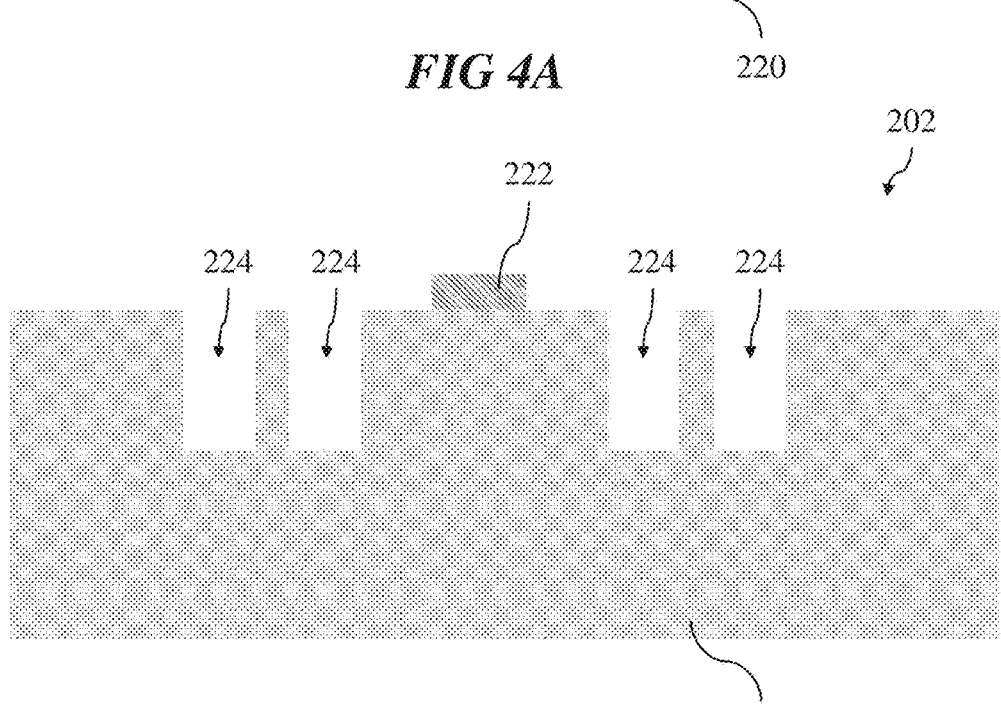

FIG. 4B depicts structure 202, which includes substrate 220 and TEOS mesa 222, where trenches 224 are formed in substrate 220. According to various embodiments, trenches 224 are formed by a lithographic patterning process. In specific embodiments, a photoresist layer is deposited, exposed through a mask, and developed according to the exposed pattern of the mask. Once the photoresist has been developed, an etching process is performed to etch trenches 224 where the photoresist is removed. In some embodiments, the etch step may use an anisotropic etch to form vertical sidewalls for trenches 224. For example, a deep reactive ion etch (DRIE) technique may be used to etch trenches 224. In other embodiments, a Bosch process etch may be performed to form trenches 224. In alternative embodiments, the etch step may use an isotropic etch with multiple intermediate steps of forming etch masks on the sidewalls. In various embodiments, trenches 224 may be etched into substrate 220 with a depth of up to 30 μm. In particular, the depth into substrate 220 of trenches 224 ranges from 1 μm to 20 μm.

Figure 4C:
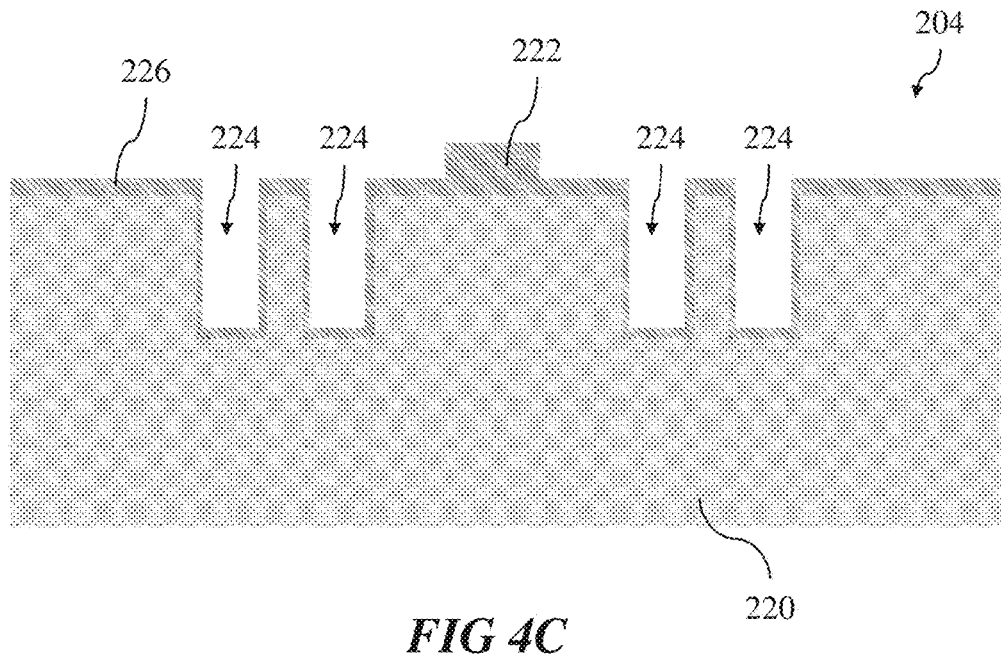

FIG. 4C depicts structure 204, which includes substrate 220, TEOS mesa 222, and oxide layer 226. According to various embodiments, oxide layer 226 is formed over the surface of substrate 220 and lines the sidewalls and bottom of trenches 224. Oxide layer 226 may be silicon oxide in some embodiments. Oxide layer 226 may be another type of oxide, nitride, or oxynitride in alternative embodiments. In some embodiments, oxide layer 226 is thermally grown. In other embodiments, oxide layer 226 is formed as a TEOS oxide in the same way as TEOS mesa 222.

Figure 4D:
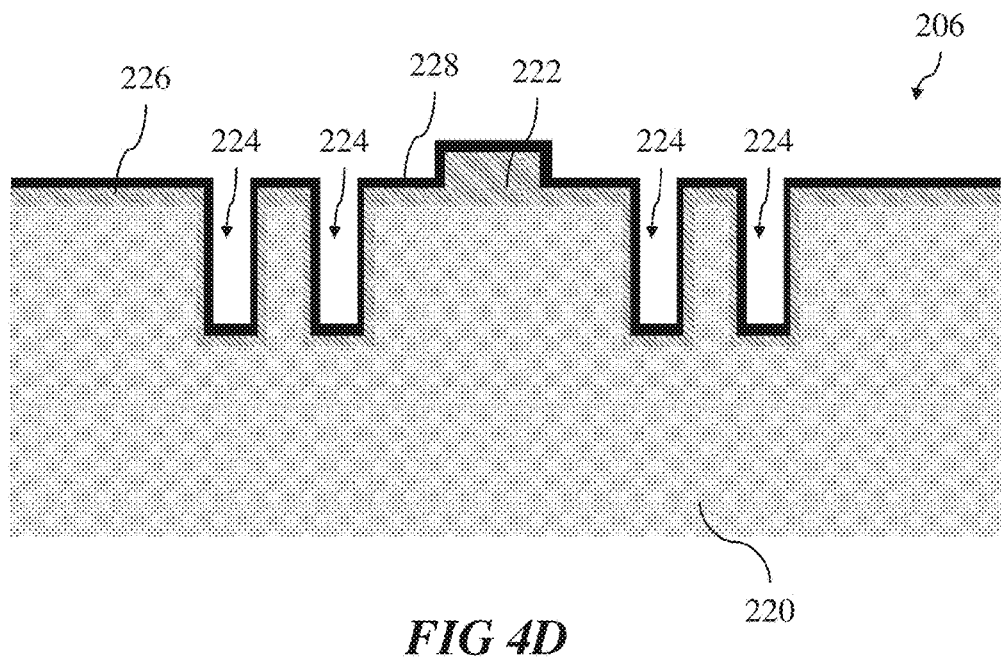

FIG. 4D depicts structure 206, which includes substrate 220, TEOS mesa 222, oxide layer 226, and nitride layer 228. According to various embodiments, nitride layer 228 is formed over the surface of substrate 220 and oxide layer 226 and also lines the sidewalls and bottom of trenches 224. In particular embodiments, nitride layer 228 is silicon nitride. Nitride layer 228 may be another type of nitride, oxide, or oxynitride in alternative embodiments. In the completed MEMS transducer, nitride layer 228 may form electrical insulation between the perpendicular electrodes. Further, nitride layer 228 may provide structural support that connects the membrane together.

Figure 4E:
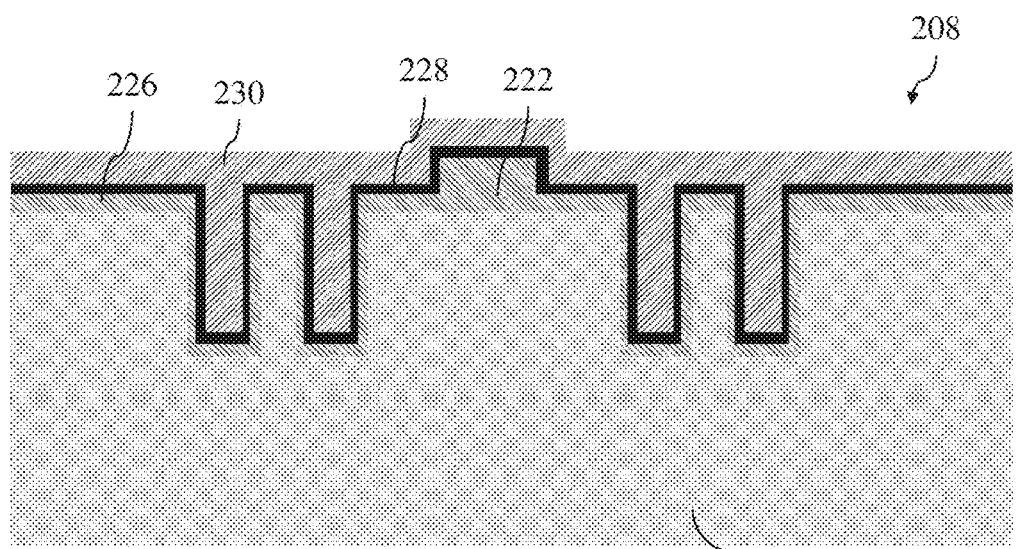

FIG. 4E depicts structure 208, which includes substrate 220, TEOS mesa 222, oxide layer 226, nitride layer 228, and polysilicon material 230. According to various embodiments, polysilicon material 230 is deposited over nitride layer 228 and fills trenches 224. Polysilicon material 230 may be deposited with a chemical vapor deposition (CVD) process in some embodiments. In particular embodiments, polysilicon material 230 is deposited in a low pressure CVD (LPCVD) process. In various alternative embodiments, polysilicon material 230 is implemented as another type of conductive or semiconductive material instead of or in addition to polysilicon. For example, polysilicon material 230 may be implemented as a metal in some alternative embodiments.

Figure 4F:
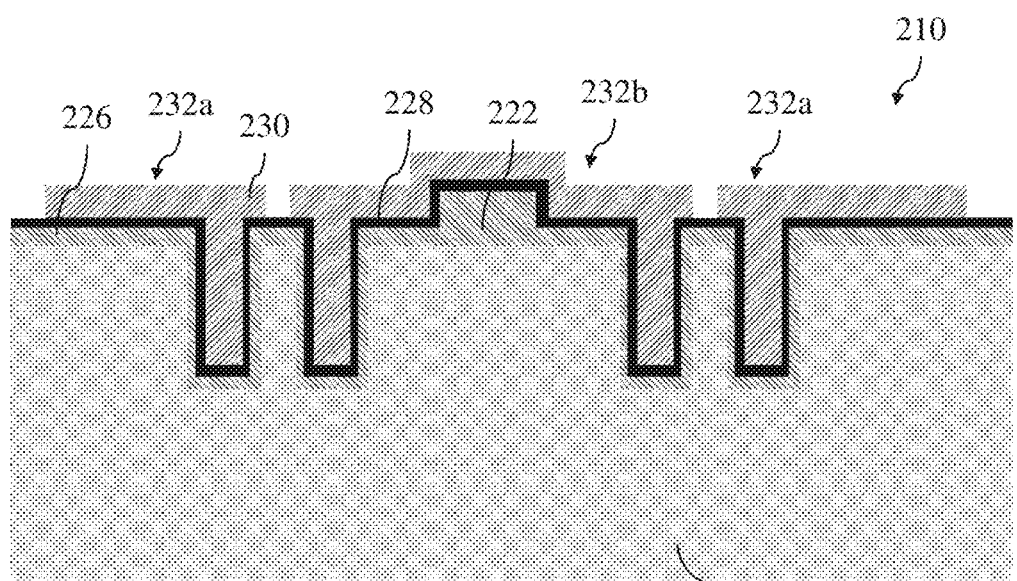

FIG. 4F depicts structure 210, which includes substrate 220, TEOS mesa 222, oxide layer 226, nitride layer 228, and polysilicon material 230 patterned into electrode 232a and electrode 232b. According to various embodiments, polysilicon material 230 is patterned using a photolithographic process and etch as similarly described in reference to forming trenches 224 in reference to FIG. 4B. In various embodiments, polysilicon material 230 is patterned into two electrodes, electrode 232a and 232b. In some embodiments, electrode 232a on the left side may extend around to electrode 232a on the right side as a circular electrode, for example, as described hereinabove in reference to FIGS. 2A and 2B. In other embodiments, polysilicon material 230 may be patterned to form any number of electrodes.

Figure 4G:
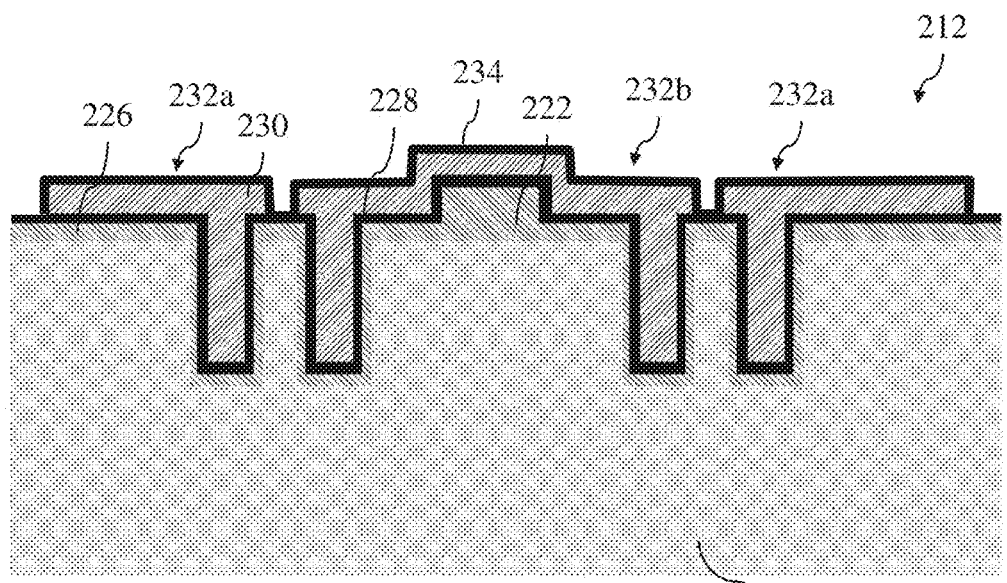

FIG. 4G depicts structure 212, which includes substrate 220, TEOS mesa 222, oxide layer 226, nitride layer 228, polysilicon material 230 patterned into electrode 232a and electrode 232b, and nitride layer 234. According to various embodiments, nitride layer 234 is deposited on nitride layer 228 and polysilicon material 230. In various embodiments, nitride layer may be formed of the same material as described hereinabove in reference to nitride layer 228.

Figure 4H:
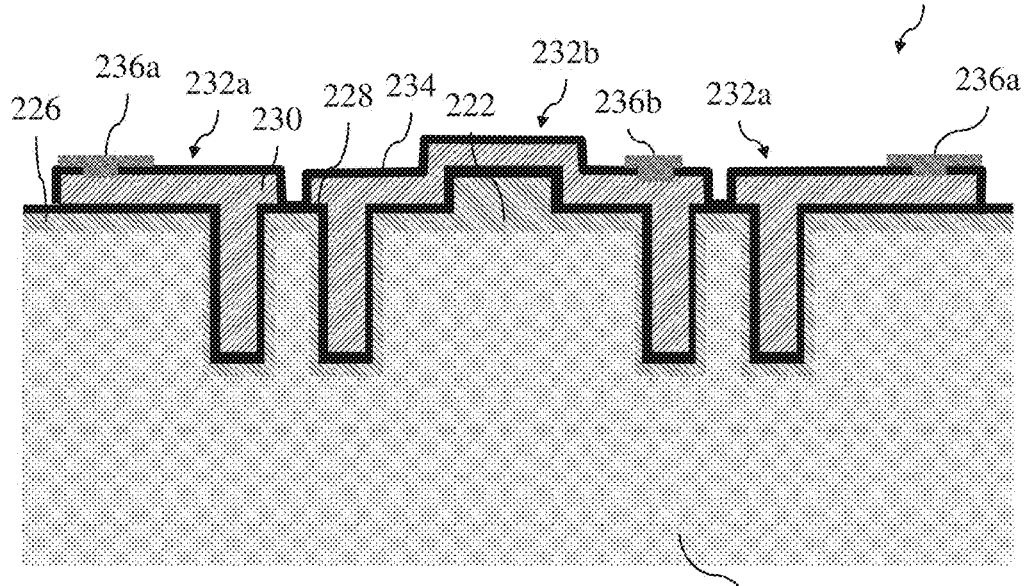

FIG. 4H depicts structure 214, which includes substrate 220, TEOS mesa 222, oxide layer 226, nitride layer 228, polysilicon material 230 patterned into electrode 232a and electrode 232b, nitride layer 234, and contact 236a and contact 236b. According to various embodiments, contact 236a and contact 236b form electrical contacts to electrode 232a and 232b, respectively. Contact 236a and contact 236b may be formed with a metallization process. In such embodiments, openings in nitride layer 234 may be formed using a photolithographic process and etch. Once openings in nitride layer 234 are formed, contact 236a and contact 236b may be formed through a metallization and patterning process. In various embodiments, contact 236a and contact 236b may be formed of aluminum, platinum, or gold. In alternative embodiments, contact 236a and contact 236b may be formed of copper. In other embodiments, contact 236a and contact 236b may be formed of polysilicon.

Figure 4I:
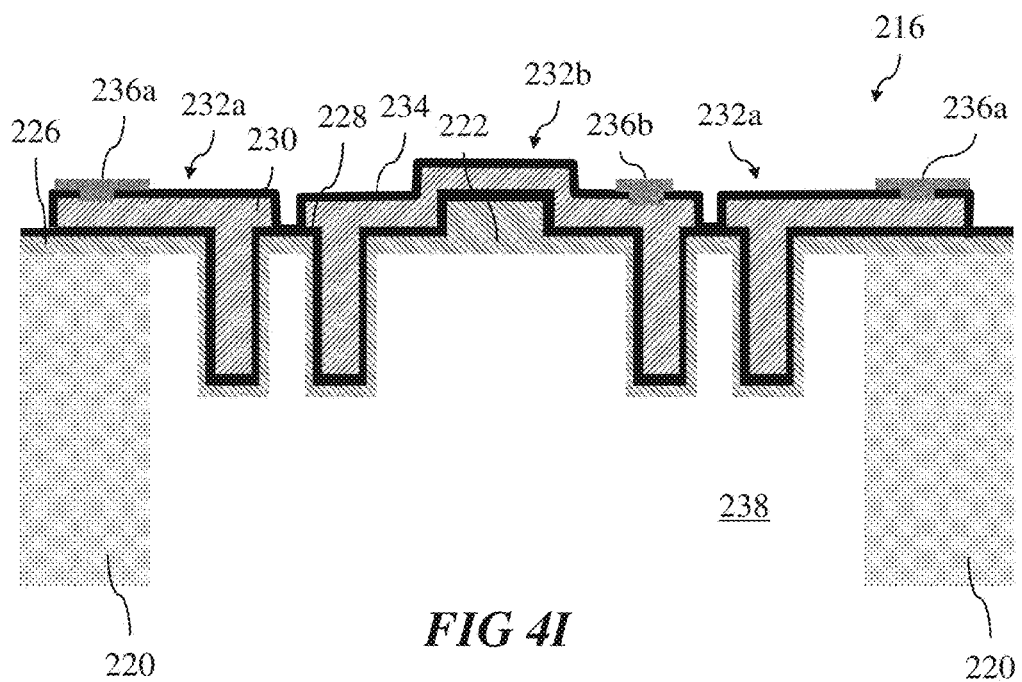

FIG. 4I depicts structure 216, which includes substrate 220 with cavity 238, TEOS mesa 222, oxide layer 226, nitride layer 228, polysilicon material 230 patterned into electrode 232a and electrode 232b, nitride layer 234, and contact 236a and contact 236b. According to various embodiments, cavity 238 is formed in substrate 220 beneath electrode 232a and electrode 232b. Cavity 238 is formed in substrate 220 using a Bosch etch process. In such embodiments, substrate 220 is repeatedly etched from the backside using an isotropic etch followed by the formation of a passivation layer or etch mask on the etched sidewalls. The process is repeated until etching through substrate 220 from the backside. In such embodiments, oxide layer 226 serves as an etch stop to protect polysilicon material 230.

Figure 4J:
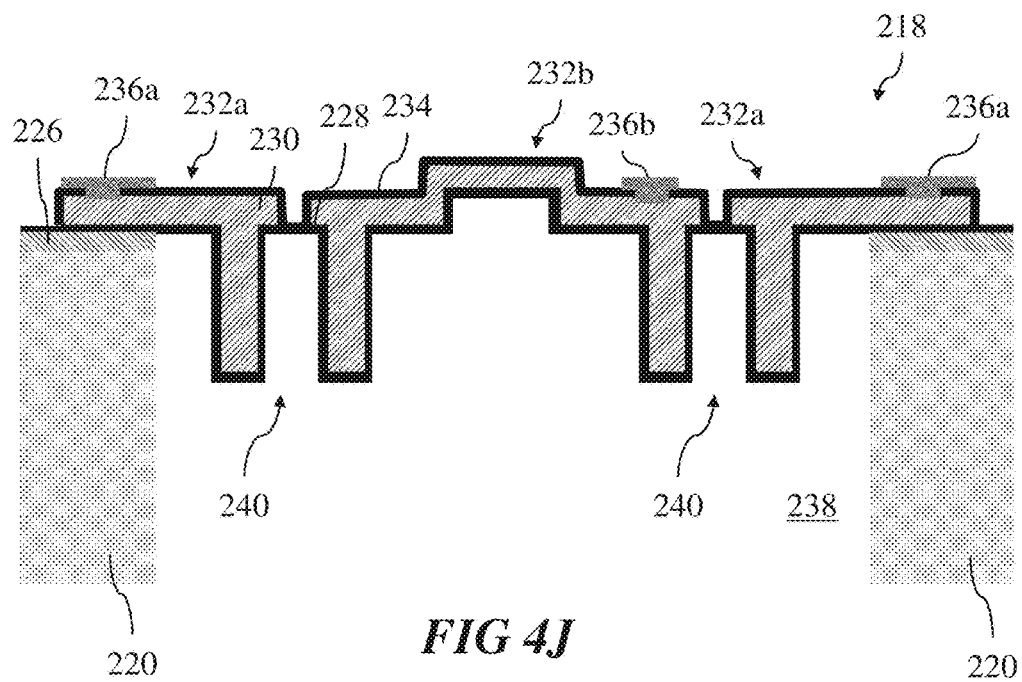

FIG. 4J depicts structure 218, which includes substrate 220 with cavity 238, oxide layer 226, nitride layer 228, polysilicon material 230 patterned into electrode 232a and electrode 232b, nitride layer 234, and contact 236a and contact 236b. According to various embodiments, oxide layer 226 is removed in cavity 238 during a release etch. In such embodiments, oxide layer 226 is present between nitride layer 228 and substrate 220. After the release etch, nitride layer 228, polysilicon material 230, and nitride layer 234 together form a membrane for the MEMS transducer. Electrode 232a and electrode 232b form perpendicular electrode pairs 240. In various embodiments, structure 218 is the MEMS transducer.

In various embodiments, the membrane may have layer stress that causes a deflection after the release etch. In such embodiments, nitride layer 228 and polysilicon layer 230 may be formed in order to produce a compressive layer stress that causes a deflection following the release etch. In various embodiments, additional materials or other techniques may be used to produce a layer stress that causes a deflection after the release etch. Those having ordinary skill in the art will readily appreciate the considerations or modification necessary to produce a layer stress, such as an intrinsic layer stress, that will produce an unbiased deflection of the membrane following the release etch.

According to various embodiments, operation of the MEMS transducer, i.e., structure 218, is described hereinabove in reference to FIGS. 1, 2A, 2B, 3A, and 3B. For example, perpendicular electrode pairs 240 may operate as described hereinabove in reference to perpendicular electrode pairs 124 in FIGS. 2A and 2B. As described previously, embodiment MEMS transducers may include any number of perpendicular electrode pairs. Structure 218 includes only two perpendicular electrode pairs 240, but other embodiments may include only a single perpendicular electrode pair or more than two. Further, structure 218 includes a corrugation formed through the patterning of TEOS mesa 222. In other embodiments, TEOS mesa 222 is omitted and structure 218 is formed with a planar membrane without any corrugations. In various embodiments, the process steps described hereinabove in reference to FIGS. 4A, 4B, 4C, 4D, 4E, 4F, 4G, 4H, 4I, and 4J may also be applied to a MEMS transducer with more or less corrugations compared to structure 218.

In various embodiments, perpendicular electrode pairs 240 may extend downward from the membrane a distance up to 30 μm. In specific embodiments, perpendicular electrode pairs 240 extend downward from the membrane by a distance ranging from 1 μm to 20 μm. In various embodiments, cavity 238 is a circular cavity and the membrane is a circular membrane fixed around the circumference to oxide layer 226. The diameter of cavity 238, and the corresponding diameter of the membrane, ranges from 500 μm to 2 mm. In alternative embodiments, the diameter of cavity 238, and the corresponding diameter of the membrane, is outside this range. In particular embodiments, the diameter of cavity 238, and the corresponding diameter of the membrane, is 1 mm.

Figure 5:
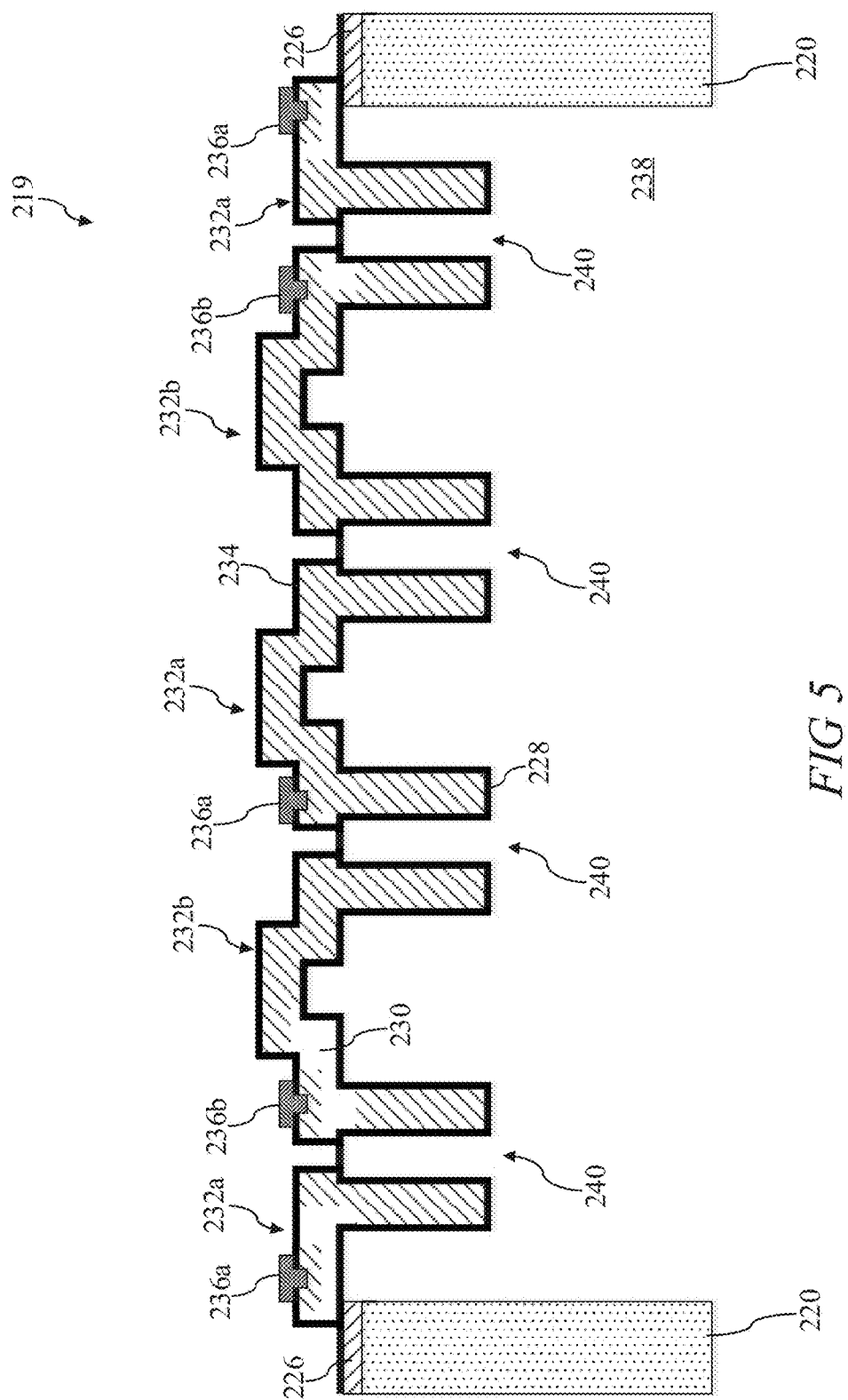
FIG. 5 illustrates a cross sectional diagram of another embodiment MEMS transducer.

FIG. 5 illustrates a cross sectional diagram of another embodiment MEMS transducer 219 including substrate 220; oxide layer 226; electrode 232a and electrode 232b including polysilicon material 230, nitride layer 228, and nitride layer 234; and contact 236a and contact 236b. According to various embodiments, MEMS transducer 219 is similar to structure 218 in FIG. 4J, with the addition of more perpendicular electrode pairs 240 and corresponding corrugations. MEMS transducer 219 is formed using the same fabrication sequence as described hereinabove in reference to FIGS. 4A, 4B, 4C, 4D, 4E, 4F, 4G, 4H, 4I, and 4J, but includes modified masks for forming four perpendicular electrode pairs 240 instead of two. In various embodiments, the same fabrication process may be used to form any number of perpendicular electrode pairs 240 with circular or parallel line configurations in a MEMS transducer. In such embodiments, corrugations in the final membrane may be included or omitted by including or omitting TEOS mesas, respectively, in alternative embodiments, as described hereinabove in reference to FIGS. 4A, 4B, 4C, 4D, 4E, 4F, 4G, 4H, 4I, and 4J.

According to various embodiments, electrode 232a includes multiple perpendicular electrodes that are coupled together through contact 236a and electrically conductive couplings (not shown) that are coupled to contact 236a. Similarly, electrode 232b includes multiple perpendicular electrodes that are coupled together through contact 236b and electrically conductive couplings (not shown) that are coupled to contact 236b. Further, each perpendicular electrode of electrode 232a and electrode 232b may be circular in some embodiments, as described hereinabove in reference to MEMS transducer 120 in FIGS. 2A and 2B. In alternative embodiments, electrode 232a and electrode 232b may be further divided into multiple perpendicular electrodes that may be coupled to separate electrical connections. Thus, electrode 232a and electrode 232b may each be respectively decoupled to form electrodes 232a, 232b, 232c, 232d, etc. In such embodiments, any number of perpendicular electrodes may be implemented. In various embodiments, the perpendicular electrodes or electrode 232a and electrode 232b may be concentric circular electrodes or formed on the membrane or parallel line electrodes formed on the membrane.

Figure 6A:
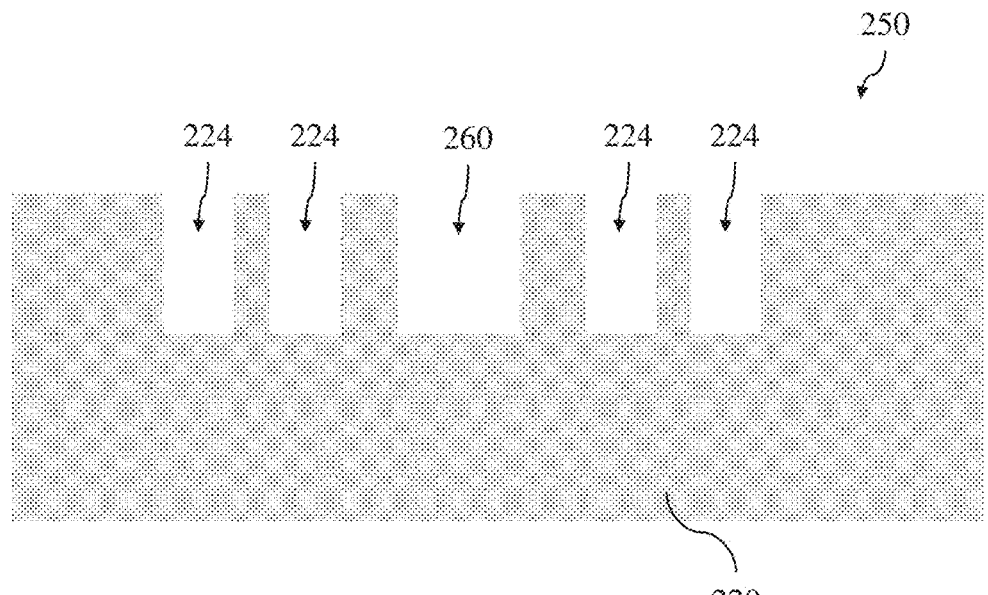
FIGS. 6A and 6B illustrate cross sectional diagrams of a further embodiment MEMS transducer at different steps in a further embodiment fabrication process.
Figure 6B:
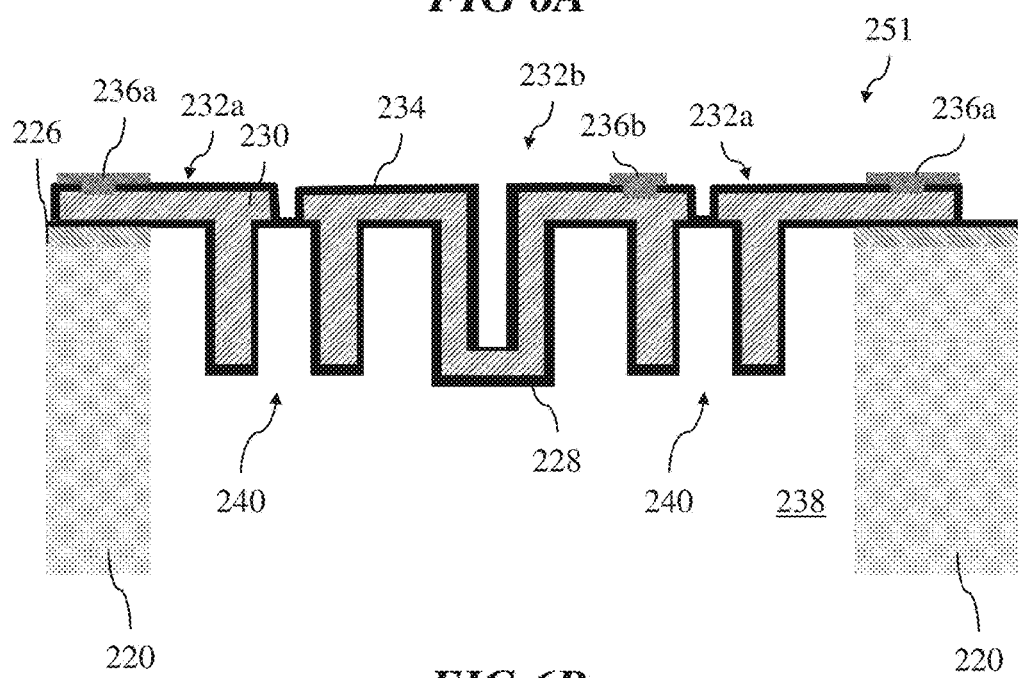

FIGS. 6A and 6B illustrate cross sectional diagrams of a further embodiment MEMS transducer at two different steps in a further embodiment fabrication process. According to various embodiments, FIGS. 6A and 6B depict structure 250 after a first step corresponding to structure 202, described hereinabove in reference to FIG. 4B, and structure 251 after a final step in the embodiment fabrication sequence. The fabrication sequence described hereinabove in reference to FIGS. 4A, 4B, 4C, 4D, 4E, 4F, 4G, 4H, 4I, and 4J is similarly applied to form structure 251 in FIG. 6B. In such embodiments, the layers and process steps are applied as described hereinabove in reference to FIGS. 4A, 4B, 4C, 4D, 4E, 4F, 4G, 4H, 4I, and 4J with the exception of forming trench 260.

According to various embodiments, trench 260 may be formed at the same time and in the same manner as described hereinabove in reference to trenches 224. Further, trench 260 may be formed in order to provide a deep trench corrugation. In specific embodiments, TEOS mesa 222, described hereinabove in reference to FIG. 4A, may be omitted and trench 260 may be formed instead. Following the formation of trench 260, the fabrication process is continued as described in reference to FIGS. 4C, 4D, 4E, 4F, 4G, 4H, 4I, and 4J in order to produce structure 251, which has the same layer stack as structure 218, but includes a deep trench corrugation, due to trench 260, instead of a raised corrugation, due to TEOS mesa 222. Thus, the layers of structure 251, as well as the corresponding methods of forming the layers, are described hereinabove in reference FIGS. 4A, 4B, 4C, 4D, 4E, 4F, 4G, 4H, 4I, and 4J.

According to various embodiments, trench 260 may have a depth that is the same as trenches 224. In alternative embodiments, trench 260 may have a different depth. In various embodiments, trench 260 may be etched into substrate 220 with a depth of up to 30 µm. In particular, the depth into substrate 220 of trench 260 ranges from 1 µm to 20 µm. In various embodiments, the width of trench 260 is three times the width of trench 224 or wider. In some embodiments, the width of trench 260 is more than twice the width of trench 224, but less than three times the width of trench 224. In particular embodiments, the width of trench 260 is less than twice the width of trench 224. In specific embodiments, the width of trench 224 ranges from 1 µm to 5 µm. In particular embodiments, the width of trench 224 depends on the thickness of the final structure, e.g., the polysilicon material 230, that is mechanically stable while providing space for the insulating layer, e.g., nitride layer 228. For example, the width of trench 224 may be set to the thickness of polysilicon material 230 plus twice the thickness of nitride layer 228. As a specific example, for a 2 µm thick polysilicon material plus 500 nm thick nitride layer, a trench width of 3 µm (2 µm+2·500 nm) may be used.

Figure 7:
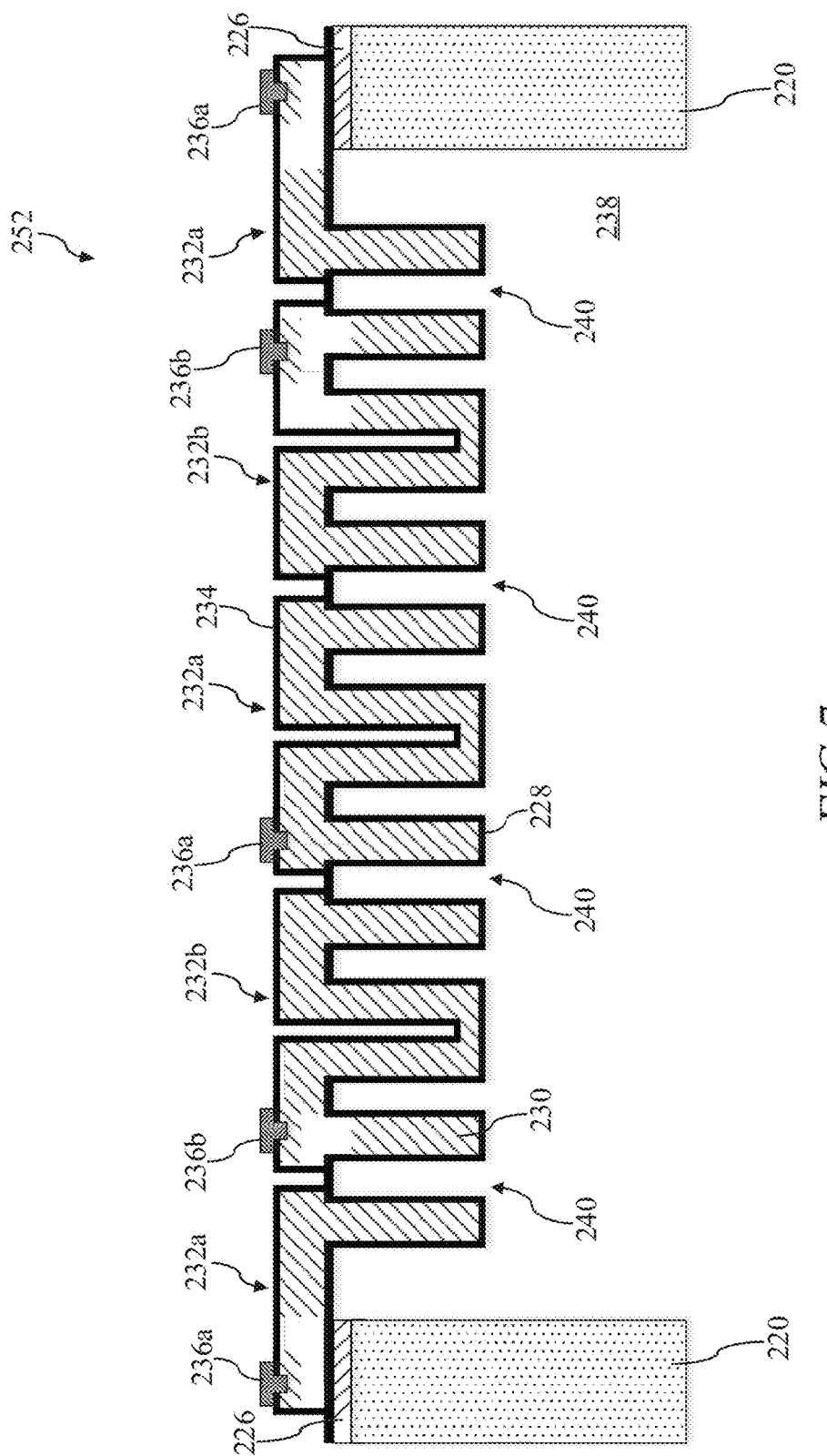
FIG. 7 illustrates a cross sectional diagram of a still further embodiment MEMS transducer.

FIG. 7 illustrates a cross sectional diagram of a still further embodiment MEMS transducer 252 including substrate 220; oxide layer 226; electrode 232a and electrode 232b including polysilicon material 230, nitride layer 228, and nitride layer 234; and contact 236a and contact 236b. According to various embodiments, MEMS transducer 252 is similar to structure 251 in FIG. 6B, with the addition of more perpendicular electrode pairs 240 and corresponding deep trench corrugations. MEMS transducer 252 is formed using the same fabrication sequence as described hereinabove in reference to FIGS. 4A, 4B, 4C, 4D, 4E, 4F, 4G, 4H, 4I, 4J, 6A, and 6B, but includes modified masks for forming four perpendicular electrode pairs 240 instead of two. In various embodiments, the same fabrication process may be used to form any number of perpendicular electrode pairs 240 in circular or parallel line configurations in a MEMS transducer.

Figure 8A:
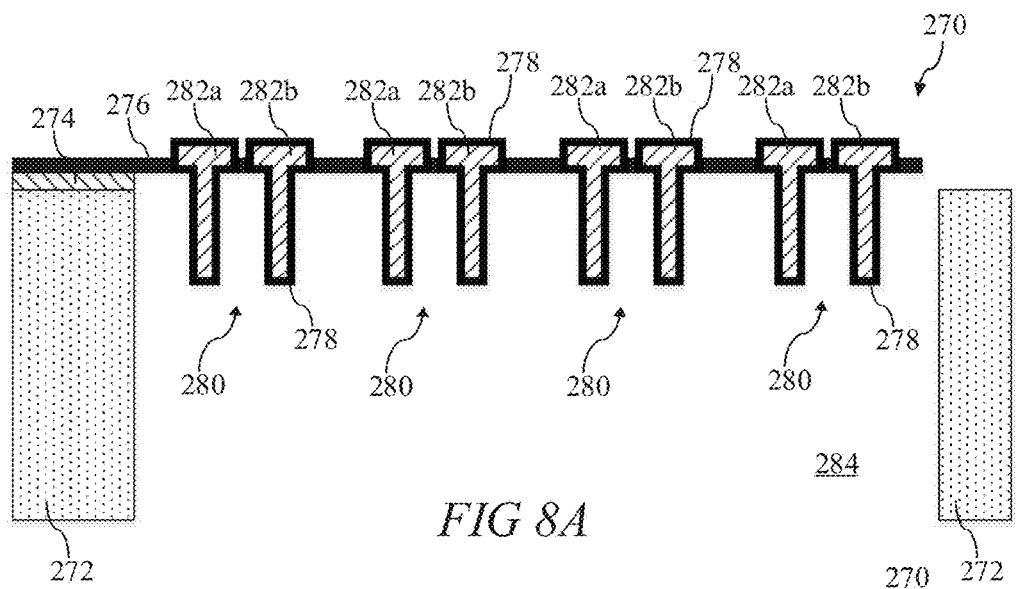
FIGS. 8A and 8B illustrate schematic side view and top view diagrams of still another embodiment MEMS transducer.
Figure 8B:
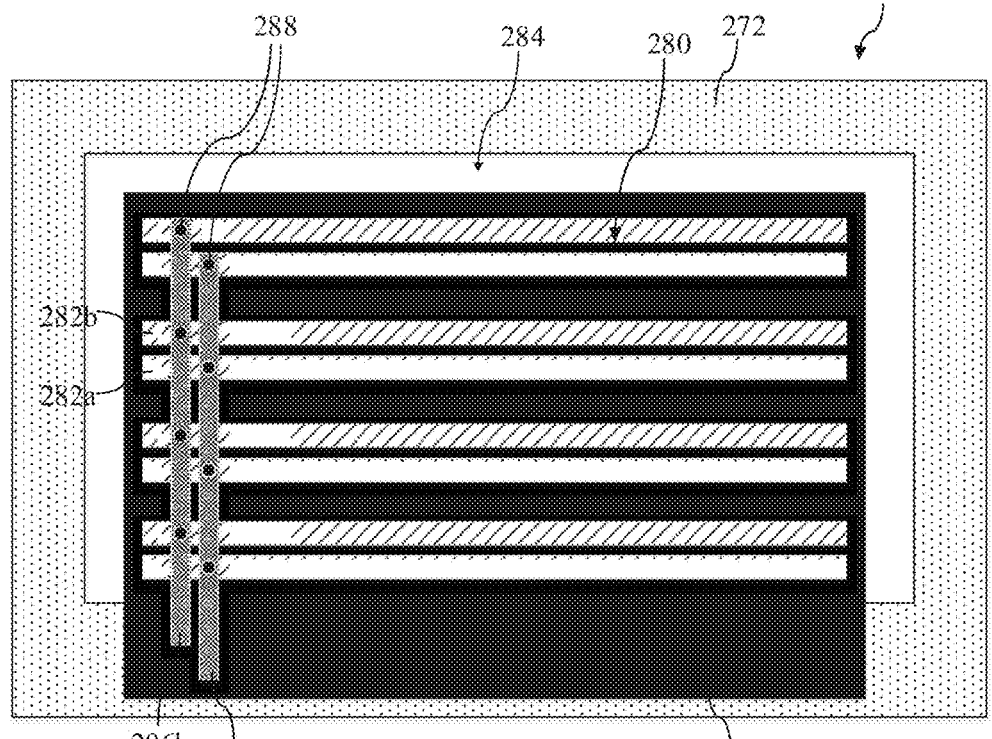

FIGS. 8A and 8B illustrate schematic side view and top view diagrams of still another embodiment MEMS transducer 270 including substrate 272, support structure 274, membrane 276, and perpendicular electrode pairs 280. According to various embodiments, membrane 276 is a flap membrane formed over cavity 284 in substrate 272. Membrane 276 may be a rectangular or square membrane fixed to support structure 274 along one edge. In other embodiments, membrane 276 has a different, non-rectangular, shape, such as a half-circle or half-oval shape fixed to support structure 274 along a diameter of the half-circle or half-oval, for example. Perpendicular electrode pairs 280 extend downward from membrane 276 and each include electrode 282a and electrode 282b. FIG. 8A illustrates the side view and shows electrode 282a and electrode 282b for each perpendicular electrode pairs 280 extending downward from membrane 276. Electrode 282a and electrode 282b may be conductive electrodes surrounded or incased in insulating material 278. In various embodiments, electrode 282a and electrode 282b may be formed of polysilicon and insulating material 278 may be formed of silicon nitride. In alternative embodiments, electrode 282a and electrode 282b may be formed of any type of electrically conductive material and insulating material 278 may be formed of any type of electrically insulating material. In some embodiments, membrane 276 and electrode 282a and electrode 282b are formed of the same material. In alternative embodiments, membrane 276 and electrode 282a and electrode 282b are formed of different materials.

According to various embodiments, contact 286a and contact 286b are electrically coupled to electrode 282a and electrode 282b, respectively, through vias 288 formed in insulating material 278. For the purposes of illustration, the top surfaces of electrode 282a and electrode 282b in FIG. 4B are not shown with insulating material 278, but these surfaces are covered with insulating material 278 in various embodiments.

According to various embodiments, support structure 274 may be an insulating layer. In some embodiments, support structure 274 is formed of nitride, oxide, or oxynitride. In particular embodiments, support structure 274 is silicon oxide. For example, support structure 274 may be formed as an etch stop for a backside etch that is performed to produce cavity 284 in substrate 272. In various embodiments, the fabrication sequence and steps, along with the relevant materials, described hereinabove in reference to FIGS. 4A, 4B, 4C, 4D, 4E, 4F, 4G, 4H, 4I, 4J, 5, 6A, 6B, and 7 may also be applied to form MEMS transducer 270. In some embodiments, modifications relevant to MEMS transducer 270 may be included as will be readily appreciated by one of skill in the art.

FIG. 9 illustrates a block diagram of an embodiment method of operating an embodiment MEMS transducer. According to various embodiments, method of operation 300 is a method of operating a MEMS transducer that has a membrane with a first pair of electrostatic drive electrodes formed on the membrane extending in an out-of-plane direction and forming a variable capacitance between the first pair of electrostatic drive electrodes. Method of operation 300 includes step 302, which includes transducing between out-of-plane deflection of the membrane and voltage on the first pair of electrostatic drive electrodes using the first pair of electrostatic drive electrodes. In such embodiments, transducing may include sensing or actuating. Specifically, out-of-plane deflection of the membrane may be sensed by a corresponding change in the voltage on the first pair of electrostatic drive electrodes. Similarly, out-of-plane deflection of the membrane may be actuated by applying a corresponding voltage to the first pair of electrostatic drive electrodes to produce the actuation. In various embodiments, sensing the out-of-plane deflection of the membrane may be used to implement a MEMS microphone. In some embodiments, actuating out-of-plane deflection of the membrane may be used to implement a MEMS microspeaker. In various embodiments, additional steps may be added to method of operation 300.

FIG. 10 illustrates a block diagram of an embodiment method of forming an embodiment MEMS transducer. Method of forming 310 includes steps 312-324. According to various embodiments, step 312 includes forming trenches in a substrate. Once the trenches have been formed in the substrate, step 314 includes forming an electrode layer in the trenches and over and in contact with the substrate. Step 316 includes patterning a first electrode and a second electrode in the electrode layer. In such embodiments, the first electrode and the second electrode are formed in the trenches.

According to various embodiments, step 318 includes forming an insulation layer between the first electrode and the second electrode. The first electrode, the second electrode, and the insulation layer together form a membrane for the MEMS transducer. Step 320 includes forming a first conductive line contacting the first electrode and step 322 includes forming a second conductive line contacting the second electrode. Step 324 includes etching a cavity in the substrate below the first electrode and the second electrode. According to various embodiments, additional steps may be added to method of forming 310 and the various steps may be rearranged in alternative embodiments. In various embodiments, steps 312-324 may include features or additional steps as described hereinabove in reference to FIGS. 4A, 4B, 4C, 4D, 4E, 4F, 4G, 4H, 4I, and 4J.

According to various embodiments described herein in reference to the other figures, perpendicular electrode pairs included in a deflectable membrane are generally directed downward toward a cavity formed in a support substrate. In other embodiments, the various perpendicular electrode pairs may also be directed in an upward direction. In particular embodiment MEMS transducers, the membrane includes multiple perpendicular electrode pairs with each pair alternating between being directed in an upward direction and in a downward direction.

Figure 11A:
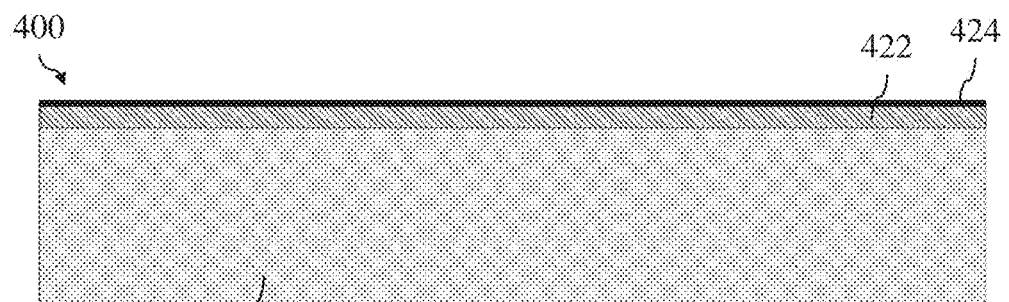
FIGS. 11A, 11B, 11C, 11D, 11E, 11F, and 11G illustrate cross sectional diagrams of a further embodiment MEMS transducer at different steps in another embodiment fabrication process.

Specifically, FIGS. 11A, 11B, 11C, 11D, 11E, 11F, and 11G illustrate cross sectional diagrams of a further embodiment MEMS transducer at different steps in another embodiment fabrication process. FIG. 11A depicts structure 400, which includes substrate 420, oxide layer 422, and nitride layer 424. Substrate 420 may include any of the materials described hereinabove in reference to substrate 220. Oxide layer 422 may be silicon oxide. In particular embodiments, oxide layer 422 is a TEOS oxide layer. In other embodiments, oxide layer 422 may be another type of insulating material. Oxide layer 422 has a thickness ranging from 100 nm to 2 µm in some embodiments. In a particular embodiment, oxide layer 422 has a thickness of 500 nm. In other embodiments, oxide layer 422 may have a different thickness. Similarly, nitride layer 424 has a thickness ranging from 1 nm to 200 nm in some embodiments. In a particular embodiment, nitride layer 424 has a thickness of 50 nm. In other embodiments, nitride layer 424 may have a different thickness.

In various embodiments, nitride layer 424 and oxide layer 422 together form an etch stop layer. Nitride layer 424 may be part of a final membrane in some embodiment. In other embodiments, oxide layer 422 and nitride layer 424 may be replaced with other dielectric or structural materials.

Figure 11B:
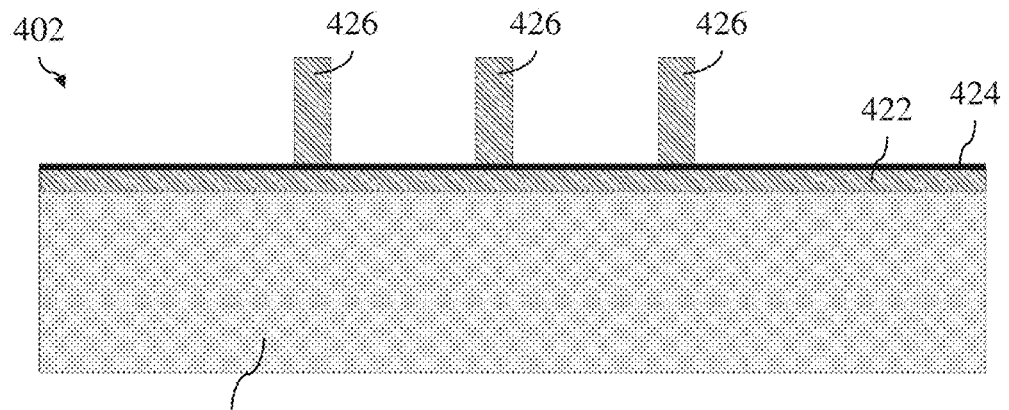

FIG. 11B depicts structure 402, which includes oxide fins 426 formed on nitride layer 424. In various embodiments, oxide fins 426 may be formed of numerous materials, such as polymers, oxides, nitrides, or oxynitrides. In one embodiment, oxide fins 426 are formed as a TEOS oxide. Forming oxide fins 426 may include applying a photoresist (or other thick patternable layer), patterning the photoresist to include trenches, and forming the TEOS oxide in the patterned trenches. In another embodiment, forming oxide fins 426 may include forming a TEOS oxide, applying a photoresist, patterning the photoresist, and etching the TEOS oxide around oxide fins 426. In alternative embodiments, oxide fins 426 may be formed using other fabrication steps known to those of skill in the art and depending on the material used in oxide fins 426. In various embodiments, oxide fins 426 have a height ranging from 1 µm to 10 µm, a width ranging from 500 nm to 3 µm, and a pitch (between oxide fins) ranging from 3 µm to 30 µm. In a particular embodiment, oxide fins 426 have a height of 5 µm, a width of 1 µm, and a pitch of 10 µm. In alternative embodiments, oxide fins 426 have other dimensions outside these ranges.

Figure 11C:
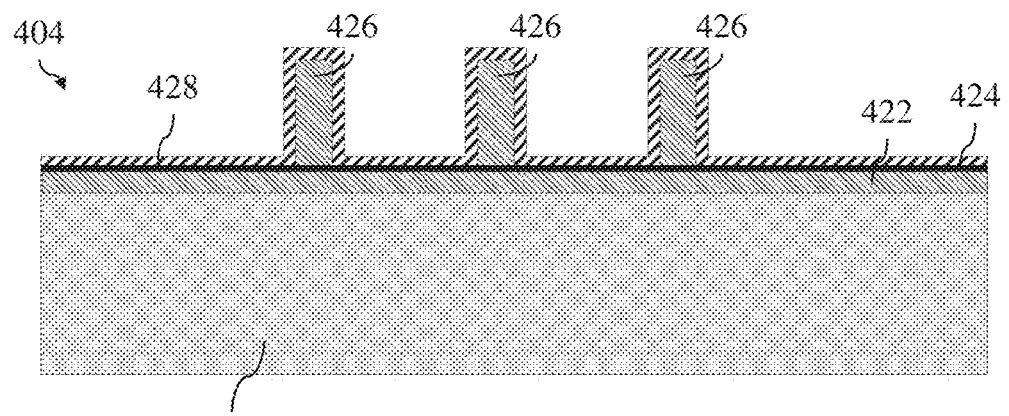

FIG. 11C depicts structure 404, which includes polysilicon layer 428 formed on nitride layer 424 and oxide fins 426. In various embodiments, polysilicon layer 428 may be deposited as a conformal layer. For example, polysilicon layer 428 may be deposited using a LPCVD process. Polysilicon layer 428 is polysilicon in various embodiments. In other embodiments, polysilicon layer 428 may be another conductive material, such as a metal. For example, polysilicon layer 428 may be aluminum, copper, gold, platinum, or an alloy of such metals in various embodiments.

Figure 11D:
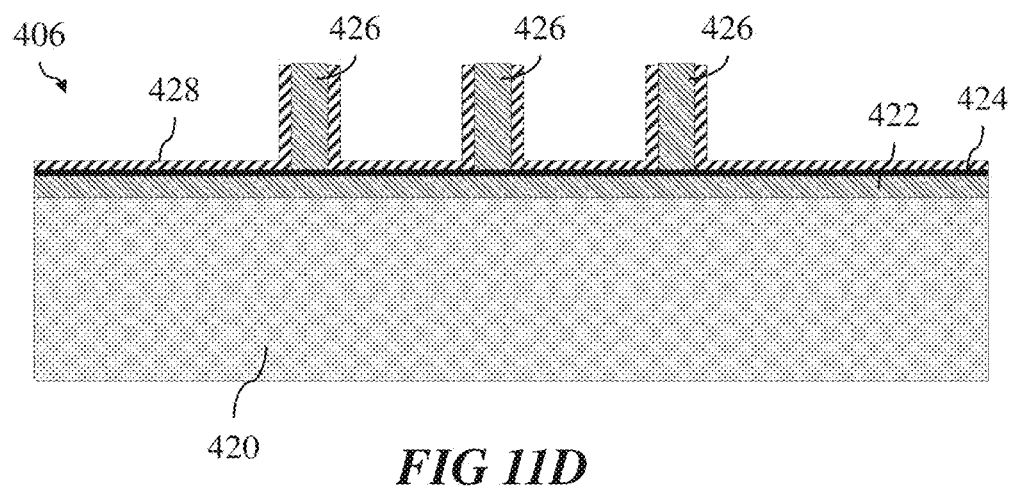

FIG. 11D depicts structure 406, which includes polysilicon layer 428 formed on nitride layer 424 and oxide fins 426 with polysilicon layer 428 removed from the tops of oxide fins 426. In various embodiments, polysilicon layer 428 may be removed from the tops of oxide fins 426 using a chemical mechanical polish (CMP) process that removes just the top portion of polysilicon layer 428 covering oxide fins 426. In such embodiments, a supporting fill material may be used to fill-in the area around and between oxide fins 426 during the CMP process. The fill material may provide support during the CMP process and may be removed after completing the CMP process. In other embodiments, polysilicon layer 428 may be patterned using a photolithographic process, for example.

Figure 11E:
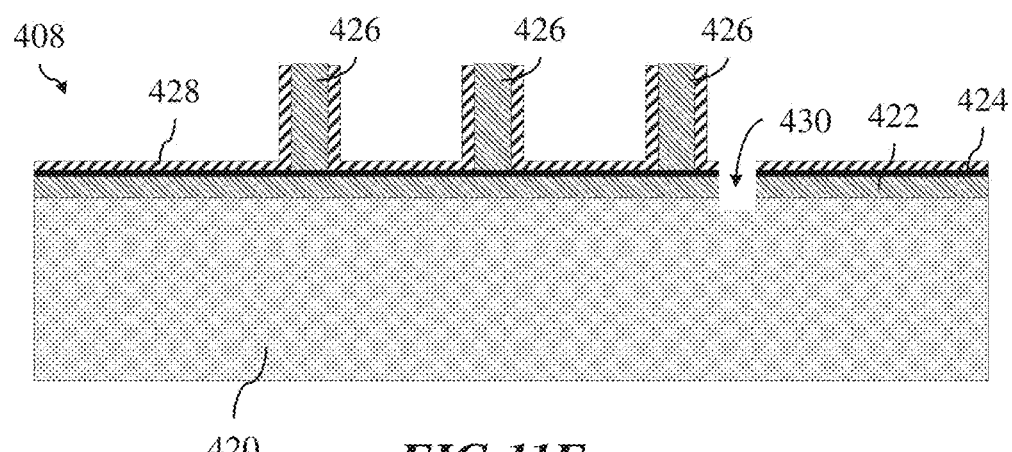

FIG. 11E depicts structure 408, which includes via 430 formed through polysilicon layer 428, nitride layer 424, and oxide layer 422 into substrate 420. In various embodiments, via 430 is formed through a photolithographic process in order to form contacts to various layers in structure 406. During the step of forming contacts, other patterning may be performed for forming contacts as shown in reference to via 430.

Figure 11F:
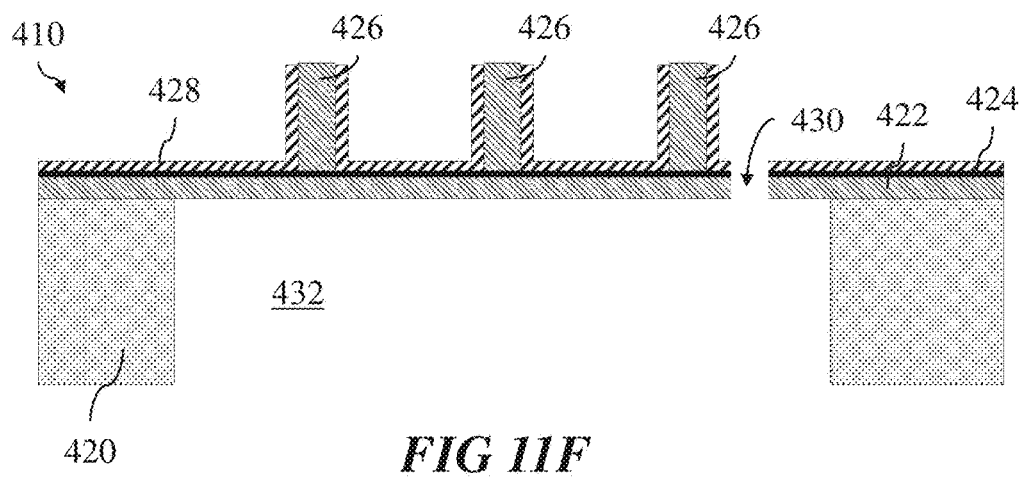

FIG. 11F depicts structure 410, which includes cavity 432 formed in substrate 420. In various embodiments, cavity 432 is formed through a Bosch etch process. In alternative embodiments, cavity 432 may be formed through another type of etch process. For example, alternative etching processes may be used when substrate 420 is formed of various alternative substrate materials, such as polymers.

Figure 11G:
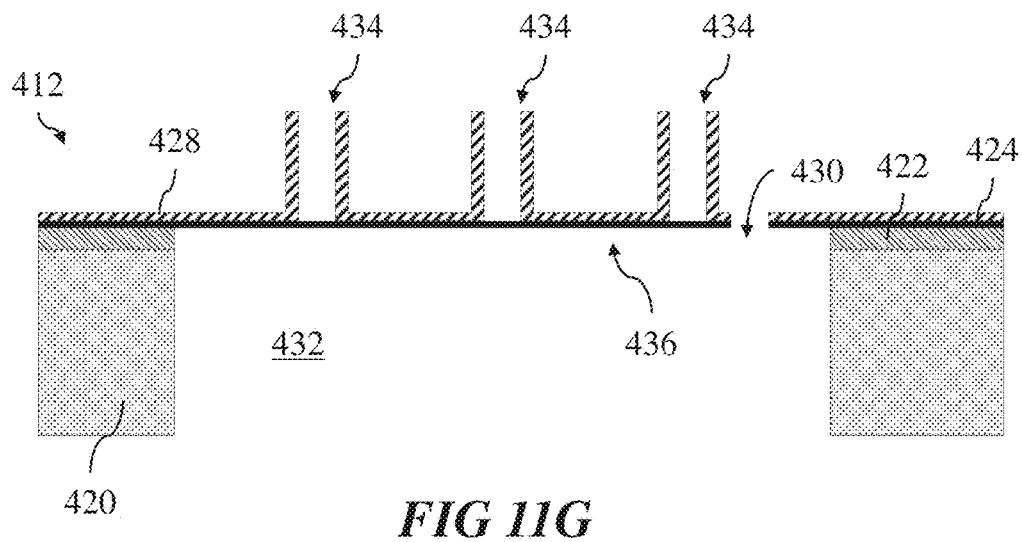

FIG. 11G depicts structure 412, which includes a perpendicular electrode pairs 434. In various embodiments, perpendicular electrode pairs 434 are formed from polysilicon layer 428 through a release etch that removes a portion of oxide layer 422 below perpendicular electrode pairs 434 and oxide fins 426 between each perpendicular electrode of perpendicular electrode pairs 434. After the release etch, polysilicon layer 428 and nitride layer 424 together form released membrane 436 with upward facing perpendicular electrode pairs 434. As described hereinabove in reference to the other figures, released membrane 436 may have various shapes, such as circular or rectangular. In a further embodiment, an insulating layer (not shown) may be deposited on polysilicon layer 428. The insulating layer may be formed of an oxide, a nitride, or an oxynitride in various embodiments. Further, as described hereinabove in reference to FIGS. 2A, 2B, 5, and 7, for example, structure 412 may include any number of perpendicular electrode pairs 434 in other embodiments.

Figure 12:
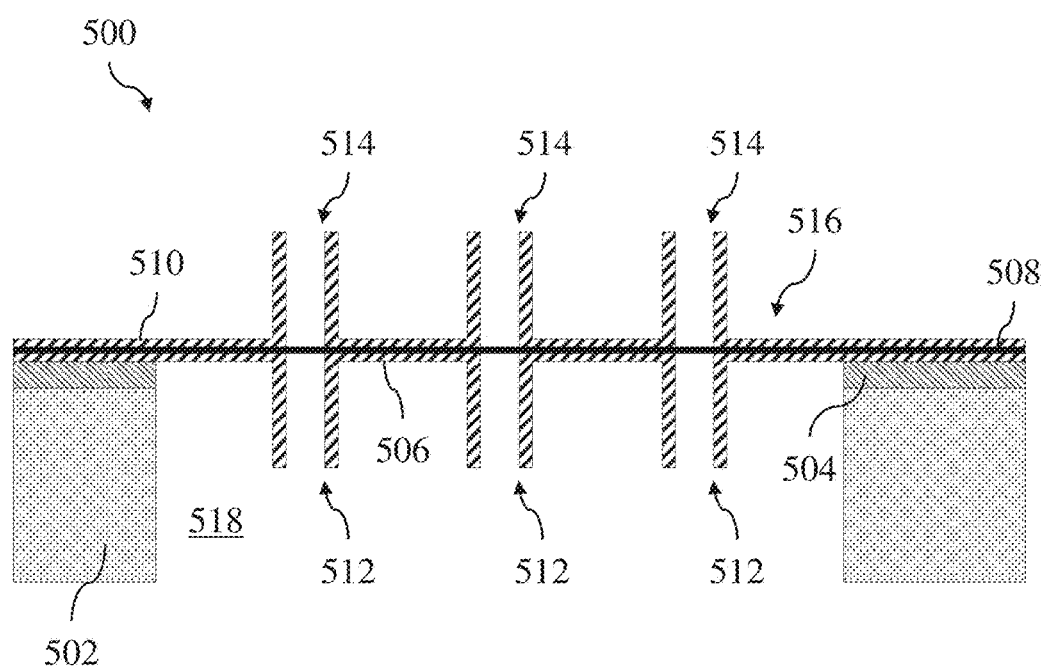
FIG. 12 illustrates a cross sectional diagram of an additional embodiment MEMS transducer.

FIG. 12 illustrates a cross sectional diagram of an additional embodiment MEMS transducer 500 including downward facing perpendicular electrode pairs 512 and upward facing perpendicular electrode pairs 514. According to various embodiments, MEMS transducer 500 may be formed by combining fabrication sequences described hereinabove. For example, the fabrication sequence described hereinabove in reference FIGS. 4A, 4B, 4C, 4D, 4E, 4F, 4G, 4H, 4I, and 4J may be combined with the fabrication sequence described in reference to FIGS. 11A, 11B, 11C, 11D, 11E, 11F, and 11G. In such embodiments, substrate 502 may have oxide layer 504 disposed on a top surface, with cavity 518 formed, such as by using a Bosch etch process, in substrate 502 and oxide layer 504. Nitride layer 508 may be sandwiched between polysilicon layer 506 and polysilicon layer 510. Downward facing perpendicular electrode pairs 512 are formed in polysilicon layer 506 and upward facing perpendicular electrode pairs 514 are formed in polysilicon layer 510.

According to various embodiments, MEMS transducer 500 may be formed using any of the techniques, or combinations of any of the techniques, described hereinabove in reference to the other embodiments in the other Figures. Specifically, any of the structures or materials of MEMS transducer 500 may include any of the materials described hereinabove in reference to the other embodiments in the other Figures. For example, downward facing perpendicular electrode pairs 512, upward facing perpendicular electrode pairs 514, or both electrode pairs, may include an insulating layer disposed over the surface, such as described hereinabove in reference to insulating material 278 in FIGS. 8A and 8B. Those having skill in the art will readily appreciate the numerous combinations and modifications of embodiments described herein.

According to an embodiment, a method of operating a MEMS transducer that has a membrane includes transducing between out-of-plane deflection of the membrane and voltage on a first pair of electrostatic drive electrodes using the first pair of electrostatic drive electrodes. The first pair of electrostatic drive electrodes is formed on the membrane extending in an out-of-plane direction and forming a variable capacitance between the first pair of electrostatic drive electrodes. Other embodiments include corresponding systems and apparatus, each configured to perform various embodiment methods.

In various embodiments, transducing between out-of-plane deflection of the membrane and voltage on a first pair of electrostatic drive electrodes includes generating an electrostatic force between the first pair of electrostatic drive electrodes by applying a voltage to the first pair of electrostatic drive electrodes, generating a force on the membrane at the first pair of electrostatic drive electrodes by moving the first pair of electrostatic drive electrodes based on the electrostatic force, and deflecting the membrane based on the force. In some embodiments, transducing between out-of-plane deflection of the membrane and voltage on a first pair of electrostatic drive electrodes further includes generating an acoustic signal by deflecting the membrane. In additional embodiments, transducing between out-of-plane deflection of the membrane and voltage on a first pair of electrostatic drive electrodes includes deflecting the membrane and generating a voltage signal at the first pair of electrostatic drive electrodes based on deflecting the membrane. In such embodiments, transducing between out-of-plane deflection of the membrane and voltage on a first pair of electrostatic drive electrodes may further include determining an acoustic signal incident on the membrane based on the voltage signal.

According to an embodiment, a MEMS transducer includes a deflectable membrane and a first electrode pair on the deflectable membrane. The first electrode pair has a variable capacitance and includes first and second movable electrodes that have a variable separation distance and are movable in relation to each other. The variable capacitance depends on the variable separation distance. Other embodiments include corresponding systems and apparatus, each configured to perform various embodiment methods.

In various embodiments, the MEMS transducer further includes a second electrode pair on the deflectable membrane, where the second electrode pair has a variable capacitance and includes third and fourth movable electrodes that have a variable separation distance and are movable in relation to each other. In such embodiments, the variable capacitance depends on the variable separation distance of the third movable electrode and the fourth movable electrode. Further, in such embodiments, the first electrode pair is on a bottom surface of the deflectable membrane facing downwards and the second electrode pair is on a top surface of the deflectable membrane facing upwards.

In various embodiments, the first electrode pair is configured to adjust the variable separation distance based in deflection of the deflectable membrane. In some embodiments, the MEMS transducer further includes an interface circuit electrically coupled to the first electrode pair and configured to generate an electrical signal representative of an acoustic signal incident on the deflectable membrane based on changes in the variable separation distance. The deflectable membrane may include a layer stress that is configured to deflect the deflectable membrane in a first direction from a neutral position during an unbiased state. In additional embodiments, the MEMS transducer further includes an interface circuit electrically coupled to the first electrode pair and configured to generate an electrostatic force between the first electrode pair by applying a voltage to the first electrode pair, generate a force on the deflectable membrane at the first electrode pair by adjusting the variable separation distance based on the electrostatic force, and deflect the deflectable membrane based on the force.

In various embodiments, the first electrode pair includes a plurality of electrode pairs formed on the deflectable membrane, where each electrode pair of the plurality of electrode pairs has a respective variable capacitance and including a first respective movable electrode and a second respective movable electrode. In such embodiments, the first respective movable electrode and the second respective movable electrode have a respective variable separation distance and are movable in relation to each other. Further, the respective variable capacitance depends on the respective variable separation distance.

In various embodiments, the MEMS transducer further includes an electrically insulating material that electrically insulates the first movable electrode from the second movable electrode. In such embodiments, the electrically insulating material is silicon nitride. In some embodiments, the MEMS transducer further includes a substrate including a cavity, where the deflectable membrane is supported by the substrate and the first electrode pair overlies the cavity.

In various embodiments, the deflectable membrane is circular and fixed to a support structure on the substrate around a circumference of the deflectable membrane. The first movable electrode and the second movable electrode may be formed in concentric circles. In additional embodiments, the deflectable membrane is rectangular and fixed to a support structure on the substrate along one edge of the deflectable membrane. The first movable electrode and the second movable electrode may be formed in parallel lines.

In various embodiments, the deflectable membrane extends in a first plane and has a first layer thickness, the first movable electrode is formed on the deflectable membrane extending a first distance perpendicular to the first plane, the second movable electrode is formed on the deflectable membrane extending the first distance perpendicular to the first plane, and the first distance is greater than the first layer thickness. In some embodiments, the first layer thickness is less than or equal to 1 micron and the first distance is greater than or equal to 1 micron and less than or equal to 25 microns.

According to an embodiment, a MEMS transducer includes a corrugated membrane and a first concentric electrode pair in contact with the corrugated membrane. The first concentric electrode pair includes a first circular electrode and a second circular electrode formed concentrically and has a variable capacitance that varies with separation distance between the first circular electrode and the second circular electrode. Other embodiments include corresponding systems and apparatus, each configured to perform various embodiment methods.

In various embodiments, the MEMS transducer further includes a second concentric electrode pair in contact with the corrugated membrane. In such embodiments, the second electrode pair includes a third circular electrode and a fourth circular electrode formed concentrically and has a variable capacitance that varies with separation distance between the third circular electrode and the fourth circular electrode. Further, the first concentric electrode pair is on a bottom surface of the corrugated membrane facing downwards and the second concentric electrode pair is on a top surface of the corrugated membrane facing upwards.

In various embodiments, the MEMS transducer further includes a substrate including a cavity, where the corrugated membrane overlies the cavity. In some embodiments, the corrugated membrane is circular and fixed at a circumference to a support structure on the substrate. The first concentric electrode pair may include a plurality of concentric electrode pairs in contact with the corrugated membrane, where each concentric electrode pair of the plurality of concentric electrode pairs includes a first respective circular electrode and a second respective circular electrode formed concentrically and has a respective variable capacitance that varies with respective separation distance between the first respective circular electrode and the second respective circular electrode.

In various embodiments, the corrugated membrane includes a plurality of corrugations and a concentric electrode pair of the plurality of concentric electrode pairs is formed in each corrugation of the plurality of corrugations. In some embodiments, the corrugated membrane has a layer thickness that is less than or equal to 1 micron and the first concentric electrode pair extends away from the corrugated membrane a distance greater than or equal to 1 micron and less than or equal to 25 microns.

In various embodiments, the MEMS transducer further includes an electrically insulating material connected to the first circular electrode and the second circular electrode, where the electrically insulating material insulates the first circular electrode from the second circular electrode. In some embodiments, the corrugated membrane and the first concentric electrode pair are formed of polysilicon. The corrugated membrane may include a layer stress that is configured to deflect the corrugated membrane in a first direction from a neutral position without application of an external force.

According to an embodiment, a method of forming a MEMS transducer includes forming trenches in a substrate, forming an electrode layer in the trenches and over and in contact with the substrate, patterning a first electrode and a second electrode in the electrode layer, forming an insulation layer between the first electrode and the second electrode, forming a first conductive line contacting the first electrode, forming a second conductive line contacting the second electrode, and etching a cavity in the substrate below the first electrode and the second electrode. In such embodiments, the first electrode and the second electrode are formed in the trenches and the first electrode, the second electrode, and the insulation layer form a membrane. Other embodiments include corresponding systems and apparatus, each configured to perform various embodiment methods.

In various embodiments, the method further includes forming a corrugation patterning element at the substrate before forming the electrode layer. In some embodiments, the method further includes forming an etch mask in the trenches before forming the electrode layer and etching the etch mask to release the membrane after etching the cavity in the substrate. In additional embodiments, forming the insulation layer includes forming a first insulation layer along sidewalls and bottom surfaces in the trenches before forming the electrode layer and forming a second insulation layer on the first electrode and the second electrode after patterning the first electrode and the second electrode in the electrode layer. Forming the electrode layer and forming the insulation layer may include forming a layer stress that causes a deflection of the electrode layer and the insulation layer after a release etch.

Advantages of various embodiments described herein may include MEMS transducers that include a deflectable membrane without a perforated backplate or rigid sensing electrode offset from the membrane. Such embodiment MEMS transducers may advantageously avoid pull-in or voltage collapse and may have reduced noise, increased sensitivity, and large amplitude and frequency ranges of operation.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a microelectromechanical systems (MEMS) transducer comprising a deflectable membrane; and a first electrode pair comprising a plurality of electrode pairs formed on the deflectable membrane, each electrode pair of the plurality of electrode pairs having a respective variable capacitance and comprising a first respective movable electrode and a second respective movable electrode, the first respective movable electrode and the second respective movable electrode have a respective variable separation distance and are movable in relation to each other, and the respective variable capacitance depends on the respective variable separation distance, the method comprising:
    transducing between out-of-plane deflection of the membrane and voltage on the first electrode pair.

2. The method of claim 1, wherein transducing between out-of-plane deflection of the membrane and voltage on the first electrode pair comprises:
    generating an electrostatic force between the first electrode pair of by applying a voltage to the first electrode pair;
    generating a force on the membrane at the first electrode pair by moving the first electrode pair based on the electrostatic force; and
    deflecting the membrane based on the force.

3. The method of claim 2, wherein transducing between out-of-plane deflection of the membrane and voltage on the first electrode pair further comprises generating an acoustic signal by deflecting the membrane.

4. The method of claim 1, wherein transducing between out-of-plane deflection of the membrane and voltage on the first electrode pair comprises:
deflecting the membrane; and
generating a voltage signal at the first electrode pair first pair based on deflecting the membrane.

5. The method of claim 4, wherein transducing between out-of-plane deflection of the membrane and voltage on the first electrode pair further comprises determining an acoustic signal incident on the membrane based on the voltage signal.

6. A microelectromechanical systems (MEMS) transducer comprising:
a deflectable membrane; and
a first electrode pair comprising a plurality of electrode pairs formed on the deflectable membrane, each electrode pair of the plurality of electrode pairs having a respective variable capacitance and comprising a first respective movable electrode and a second respective movable electrode,
the first respective movable electrode and the second respective movable electrode have a respective variable separation distance and are movable in relation to each other, and
the respective variable capacitance depends on the respective variable separation distance.

7. The MEMS transducer of claim 6, further comprising a second electrode pair on the deflectable membrane, the second electrode pair having a variable capacitance and comprising a third movable electrode and a fourth movable electrode, wherein
the third movable electrode and the fourth movable electrode have a variable separation distance and are movable in relation to each other, and
the variable capacitance depends on the variable separation distance of the third movable electrode and the fourth movable electrode; and
wherein the first electrode pair is on a bottom surface of the deflectable membrane facing downwards and the second electrode pair is on a top surface of the deflectable membrane facing upwards.

8. The MEMS transducer of claim 6, wherein the first electrode pair is configured to adjust the variable separation distance based in deflection of the deflectable membrane.

9. The MEMS transducer of claim 8, further comprising an interface circuit electrically coupled to the first electrode pair and configured to generate an electrical signal representative of an acoustic signal incident on the deflectable membrane based on changes in the variable separation distance.

10. The MEMS transducer of claim 6, wherein the deflectable membrane comprises a layer stress that is configured to deflect the deflectable membrane in a first direction from a neutral position during an unbiased state.

11. The MEMS transducer of claim 6, further comprising an interface circuit electrically coupled to the first electrode pair and configured to:
generate an electrostatic force between the first electrode pair by applying a voltage to the first electrode pair;
generate a force on the deflectable membrane at the first electrode pair by adjusting the variable separation distance based on the electrostatic force; and
deflect the deflectable membrane based on the force.

12. The MEMS transducer of claim 6, further comprising an electrically insulating material that electrically insulates the first respective movable electrode from the second respective movable electrode.

13. The MEMS transducer of claim 12, wherein the electrically insulating material is silicon nitride.

14. The MEMS transducer of claim 6, further comprising a substrate comprising a cavity, wherein the deflectable membrane is supported by the substrate and the first electrode pair overlies the cavity.

15. The MEMS transducer of claim 14, wherein the deflectable membrane is circular and fixed to a support structure on the substrate around a circumference of the deflectable membrane.

16. The MEMS transducer of claim 15, wherein the first respective movable electrode and the second respective movable electrode are formed in concentric circles.

17. The MEMS transducer of claim 14, wherein the deflectable membrane is rectangular and fixed to a support structure on the substrate along one edge of the deflectable membrane.

18. The MEMS transducer of claim 17, wherein the first respective movable electrode and the second respective movable electrode are formed in parallel lines.

19. The MEMS transducer of claim 6, wherein
the deflectable membrane extends in a first plane and has a first layer thickness,
the first respective movable electrode is formed on the deflectable membrane extending a first distance perpendicular to the first plane,
the second respective movable electrode is formed on the deflectable membrane extending the first distance perpendicular to the first plane, and
the first distance is greater than the first layer thickness.

20. The MEMS transducer of claim 19, wherein the first layer thickness is less than or equal to 1 micron and the first distance is greater than or equal to 1 micron and less than or equal to 25 microns.

21. A microelectromechanical systems (MEMS) transducer comprising:
a corrugated membrane; and
a first concentric electrode pair comprising a plurality of concentric electrode pairs in contact with the corrugated membrane, each concentric electrode pair of the plurality of concentric electrode pairs comprising a first respective circular electrode and a second respective circular electrode formed concentrically and having a respective variable capacitance that varies with respective separation distance between the first respective circular electrode and the second respective circular electrode.

22. The MEMS transducer of claim 21, further comprising a second concentric electrode pair in contact with the corrugated membrane and comprising a third circular electrode and a fourth circular electrode formed concentrically and having a variable capacitance that varies with separation distance between the third circular electrode and the fourth circular electrode; and
wherein the first concentric electrode pair is on a bottom surface of the corrugated membrane facing downwards and the second concentric electrode pair is on a top surface of the corrugated membrane facing upwards.

23. The MEMS transducer of claim 21, further comprising: a substrate comprising a cavity, wherein the corrugated membrane overlies the cavity.

24. The MEMS transducer of claim 23, wherein the corrugated membrane is circular and fixed at a circumference to a support structure on the substrate.

25. The MEMS transducer of claim 21, wherein the corrugated membrane comprises a plurality of corrugations and a concentric electrode pair of the plurality of concentric electrode pairs is formed in each corrugation of the plurality of corrugations.

26. The MEMS transducer of claim 21, wherein the corrugated membrane has a layer thickness that is less than or equal to 1 micron and the first concentric electrode pair extends away from the corrugated membrane a distance greater than or equal to 1 micron and less than or equal to 25 microns.

27. The MEMS transducer of claim 21, further comprising an electrically insulating material connected to the first respective circular electrode and the second respective circular electrode, wherein the electrically insulating material insulates the first respective circular electrode from the second respective circular electrode.

28. The MEMS transducer of claim 21, wherein the corrugated membrane and the first concentric electrode pair are formed of polysilicon.

29. The MEMS transducer of claim 21, wherein the corrugated membrane comprises a layer stress that is configured to deflect the corrugated membrane in a first direction from a neutral position without application of an external force.

30. A microelectromechanical systems (MEMS) transducer comprising:

a deflectable membrane;

a first electrode pair on the deflectable membrane, the first electrode pair having a variable capacitance and comprising a first movable electrode and a second movable electrode, wherein the first movable electrode and the second movable electrode have a variable separation distance and are movable in relation to each other, and the variable capacitance depends on the variable separation distance; and a second electrode pair on the deflectable membrane, the second electrode pair having a variable capacitance and comprising a third movable electrode and a fourth movable electrode, wherein the third movable electrode and the fourth movable electrode have a variable separation distance and are movable in relation to each other, the variable capacitance depends on the variable separation distance of the third movable electrode and the fourth movable electrode, and the first electrode pair is on a bottom surface of the deflectable membrane facing downwards and the second electrode pair is on a top surface of the deflectable membrane facing upward.

* * * * *

UNITED STATES PATENT AND TRADEMARK OFFICE
CERTIFICATE OF CORRECTION

PATENT NO. : 10,104,478 B2
APPLICATION NO. : 14/941220
DATED : October 16, 2018
INVENTOR(S) : Christoph Glacer It is certified that error appears in the above-identified patent and that said Letters Patent is hereby corrected as shown below:

In the Claims

In Column 19, Lines 5-6, Claim 4, delete "at the first electrode pair first pair based on deflecting the membrane" and insert --at the first electrode pair based on deflecting the membrane--.

Signed and Sealed this
First Day of January, 2019

Andrei Iancu
*Director of the United States Patent and Trademark Office*